United States Patent
Yu et al.

(10) Patent No.: US 12,046,632 B2
(45) Date of Patent: Jul. 23, 2024

(54) SEMICONDUCTOR DEVICE HAVING AIR GAP BETWEEN GATE ELECTRODE AND SOURCE/DRAIN PATTERN

(71) Applicant: Samsung Electronics Co., Ltd., Suwon-si (KR)

(72) Inventors: Haejun Yu, Osan-si (KR); Kyungin Choi, Seoul (KR); Seung Hun Lee, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 18/182,893

(22) Filed: Mar. 13, 2023

(65) Prior Publication Data

US 2023/0223438 A1  Jul. 13, 2023

Related U.S. Application Data

(63) Continuation of application No. 17/242,823, filed on Apr. 28, 2021, now Pat. No. 11,605,711.

(30) Foreign Application Priority Data

Sep. 3, 2020  (KR) .......................... 10-2020-0112608

(51) Int. Cl.
*H01L 29/06* (2006.01)
*B82Y 10/00* (2011.01)
(Continued)

(52) U.S. Cl.
CPC .... *H01L 29/0653* (2013.01); *H01L 29/42392* (2013.01); *H01L 29/4991* (2013.01); *H01L 29/66553* (2013.01); *H01L 27/092* (2013.01)

(58) Field of Classification Search
CPC ............ H01L 29/42392; H01L 27/092; H01L 29/1079; H01L 29/0847; H01L 29/66439;
(Continued)

(56) References Cited

U.S. PATENT DOCUMENTS 9,954,058 B1    4/2018  Mochizuki et al.
10,096,688 B2   10/2018 Tak et al.
(Continued)

OTHER PUBLICATIONS

Office Action dated Jul. 26, 2022 for corresponding U.S. Appl. No. 17/242,823.

(Continued)

*Primary Examiner* — Sonya McCall-Shepard
(74) *Attorney, Agent, or Firm* — Harness, Dickey & Pierce, P.L.C.

(57) ABSTRACT

A semiconductor device includes an active pattern on a substrate, a source/drain pattern on the active pattern, a channel pattern connected to the source/drain pattern, the channel pattern including semiconductor patterns stacked and spaced apart from each other, a gate electrode extending across the channel pattern, and inner spacers between the gate electrode and the source/drain pattern. The semiconductor patterns include stacked first and second semiconductor patterns. The gate electrode includes first and second portions, which are sequentially stacked between the substrate and the first and second semiconductor patterns, respectively. The inner spacers include first and second air gaps, between the first and second portions of the gate electrode and the source/drain pattern. The largest width of the first air gap is larger than that of the second air gap.

20 Claims, 39 Drawing Sheets

(51) Int. Cl.
*H01L 21/8238* (2006.01)
*H01L 27/092* (2006.01)
*H01L 29/08* (2006.01)
*H01L 29/10* (2006.01)
*H01L 29/161* (2006.01)
*H01L 29/165* (2006.01)
*H01L 29/417* (2006.01)
*H01L 29/423* (2006.01)
*H01L 29/49* (2006.01)
*H01L 29/66* (2006.01)
*H01L 29/775* (2006.01)
*H01L 29/78* (2006.01)
*H01L 29/786* (2006.01)

(58) Field of Classification Search
CPC ............... H01L 29/775; H01L 29/0653; H01L 21/823878; H01L 29/4991; H01L 29/41725; H01L 29/7848; H01L 21/823814; H01L 29/66553; H01L 21/823864; H01L 29/6653; H01L 29/6656; H01L 29/0649; H01L 29/0673; H01L 23/485; H01L 23/5226; H01L 29/165; H01L 29/161
See application file for complete search history.

(56) References Cited

U.S. PATENT DOCUMENTS

| | | |
|---|---|---|
| 10,269,983 B2 | 4/2019 | Frougier et al. |
| 10,361,268 B2 | 7/2019 | Wostyn et al. |
| 10,553,696 B2 | 2/2020 | Ando et al. |
| 10,566,438 B2 | 2/2020 | Xie et al. |
| 10,629,740 B2 | 4/2020 | Yang et al. |
| 11,342,326 B2 * | 5/2022 | Chiu ................... H01L 29/7851 |
| 2017/0194430 A1 * | 7/2017 | Wood ................. H01L 29/0673 |
| 2018/0358435 A1 | 12/2018 | Mochizuki et al. |
| 2019/0148153 A1 | 5/2019 | Cheng et al. |
| 2019/0157444 A1 | 5/2019 | Yang et al. |
| 2019/0319028 A1 | 10/2019 | Suh et al. |
| 2020/0052086 A1 | 2/2020 | Yang et al. |
| 2020/0144388 A1 | 5/2020 | Xie et al. |
| 2021/0391466 A1 | 12/2021 | Yeong et al. |

OTHER PUBLICATIONS

Notice of Allowance dated Nov. 9, 2022 for corresponding U.S. Appl. No. 17/242,823.

* cited by examiner

SEMICONDUCTOR DEVICE HAVING AIR GAP BETWEEN GATE ELECTRODE AND SOURCE/DRAIN PATTERN

CROSS-REFERENCE TO RELATED APPLICATIONS

This application is a continuation of, and claims the benefit under 35 U.S.C. § 120 to, U.S. application Ser. No. 17/242,823, filed on Apr. 28, 2021, which claims priority under 35 U.S.C. § 119 to Korean Patent Application No. 10-2020-0112608, filed on Sep. 3, 2020, in the Korean Intellectual Property Office, the entire contents of which are hereby incorporated by reference.

BACKGROUND

The present disclosure relates to a semiconductor device, and in particular, to a semiconductor device including a field effect transistor.

A semiconductor device may include an integrated circuit including metal-oxide-semiconductor field-effect transistors (MOS-FETs). To meet an increasing demand for a semiconductor device with a small pattern size and/or a reduced design rule, MOS-FETs may be scaled down. The scale-down of the MOS-FETs may lead to deterioration in operational properties of the semiconductor device. A variety of studies are being conducted to overcome technical limitations associated with the scale-down of the semiconductor device and/or to realize higher performance semiconductor devices.

SUMMARY

Example embodiments of the inventive concepts provide a semiconductor device with improved electric characteristics.

According to example embodiments of the inventive concepts, a semiconductor device may include an active pattern on a substrate, a source/drain pattern on the active pattern, a channel pattern connected to the source/drain pattern, the channel pattern including semiconductor patterns, stacked and spaced apart from each other, a gate electrode extending across the channel pattern, and inner spacers between the gate electrode and the source/drain pattern. The semiconductor patterns may include a first semiconductor pattern at its lowermost level and a second semiconductor pattern on the first semiconductor pattern. The gate electrode may include a first portion between the substrate and the first semiconductor pattern and a second portion between the first semiconductor pattern and the second semiconductor pattern. The inner spacers may include a first air gap between the first portion of the gate electrode and the source/drain pattern and a second air gap between the second portion of the gate electrode and the source/drain pattern. The largest width of the first air gap may be larger than the largest width of the second air gap.

According to example embodiments of the inventive concepts, a semiconductor device may include an active pattern on a substrate, a source/drain pattern on the active pattern, a channel pattern connected to the source/drain pattern, the channel pattern including semiconductor patterns, stacked and spaced apart from each other, a gate electrode extending across the channel pattern, the gate electrode including a portion between the substrate and a lowermost one of the semiconductor patterns, and an inner spacer between the portion of the gate electrode and the source/drain pattern. The inner spacer may include an inner insulating pattern and an air gap, defined by the inner insulating pattern and the source/drain pattern. A width of the air gap may increase in a direction perpendicular to a top surface of the substrate until the width reaches its largest value and then the width may decrease.

According to example embodiments of the inventive concepts, a semiconductor device may include a substrate including a PMOSFET region and an NMOSFET region, adjacent to each other in a first direction, a first active pattern and a second active pattern on the PMOSFET and NMOSFET regions, respectively, a first source/drain pattern and a second source/drain pattern on the first active pattern and the second active pattern, respectively, a first channel pattern and a second channel pattern, connected to the first source/drain pattern and the second source/drain pattern, respectively, and each of which includes a first semiconductor pattern, a second semiconductor pattern, and a third semiconductor pattern that are sequentially stacked to be spaced apart from each other, a first gate electrode and a second gate electrode, crossing the first and second channel patterns, respectively, and extending in the first direction, each of the first and second gate electrodes including a first portion between the substrate and the first semiconductor pattern, a second portion between the first semiconductor pattern and the second semiconductor pattern, a third portion between the second semiconductor pattern and the third semiconductor pattern, and a fourth portion on the third semiconductor pattern, inner spacers, between the first to third portions of the second gate electrode and the second source/drain pattern, a first gate insulating layer and a second gate insulating layer, between the first channel pattern and the first gate electrode and between the second channel pattern and the second gate electrode, respectively, a first gate spacer and a second gate spacer on side surfaces of the first and second gate electrodes, respectively, a first gate capping pattern and a second gate capping pattern on top surfaces of the first and second gate electrodes, respectively, a first interlayer insulating layer on the first and second gate capping patterns, active contacts penetrating the first interlayer insulating layer and coupled to the first and second source/drain patterns, respectively, gate contacts penetrating the first interlayer insulating layer and coupled to the first and second gate electrodes, respectively, a second interlayer insulating layer on the first interlayer insulating layer, a first metal layer in the second interlayer insulating layer, the first metal layer including first interconnection lines, connected to the active contacts and the gate contacts, a third interlayer insulating layer on the second interlayer insulating layer, and a second metal layer in the third interlayer insulating layer. The second metal layer may include second interconnection lines, electrically connected to the first interconnection lines. Each of the inner spacers may include an inner insulating pattern and an air gap, defined by the inner insulating pattern and the second source/drain pattern. At least one of the first to third portions of the second gate electrode may have a recessed side surface. The inner insulating pattern may include a first horizontally-extended portion at its top level, a second horizontally-extended portion at its bottom level, and a protruding portion connecting the first and second horizontally-extended portions to each other. The protruding portion may face the recessed side surface and may have a profile corresponding to the recessed side surface.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

DETAILED DESCRIPTION

Figure 1:
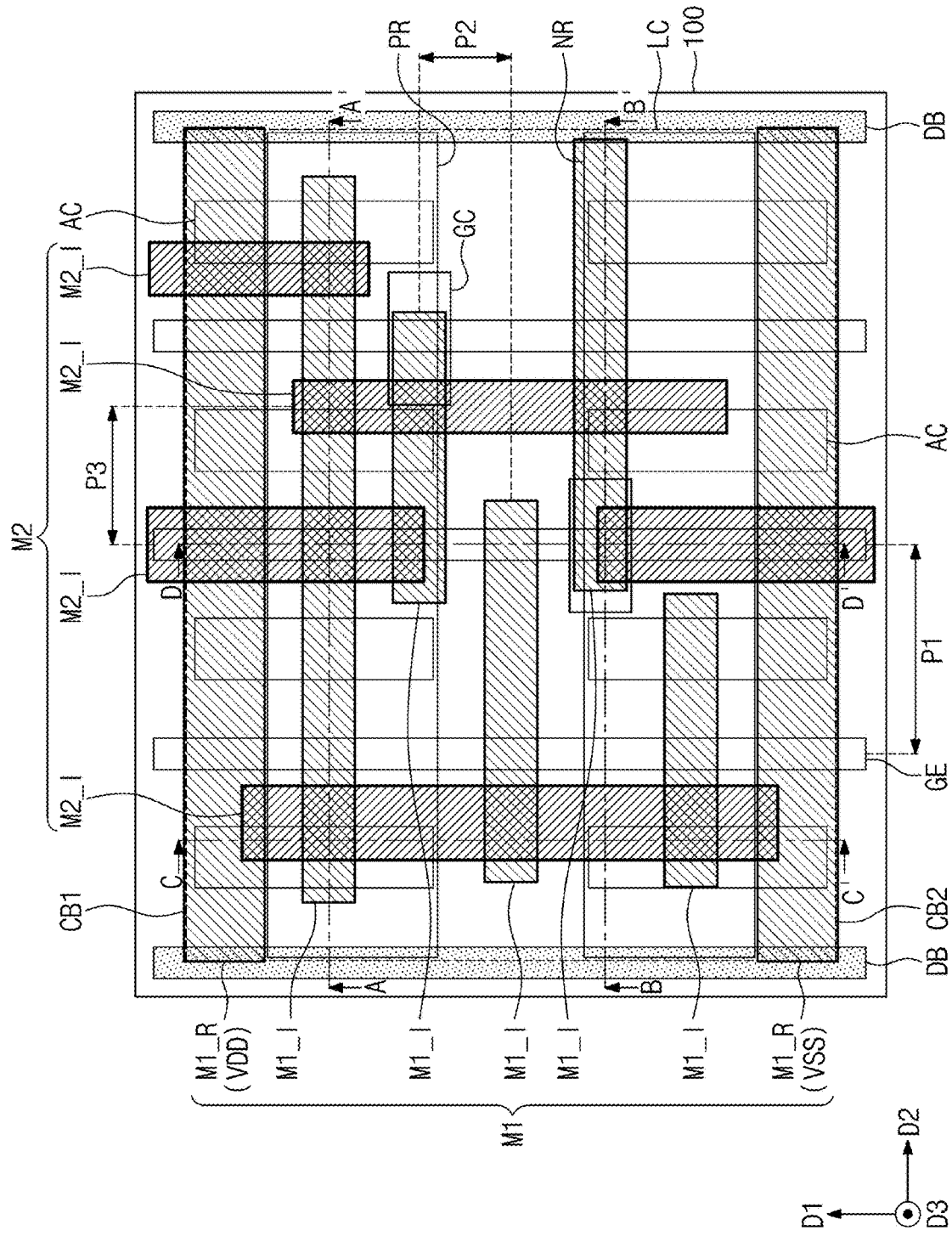
FIG. 1 is a plan view illustrating a semiconductor device according to example embodiments of the inventive concepts.
Figure 2A:
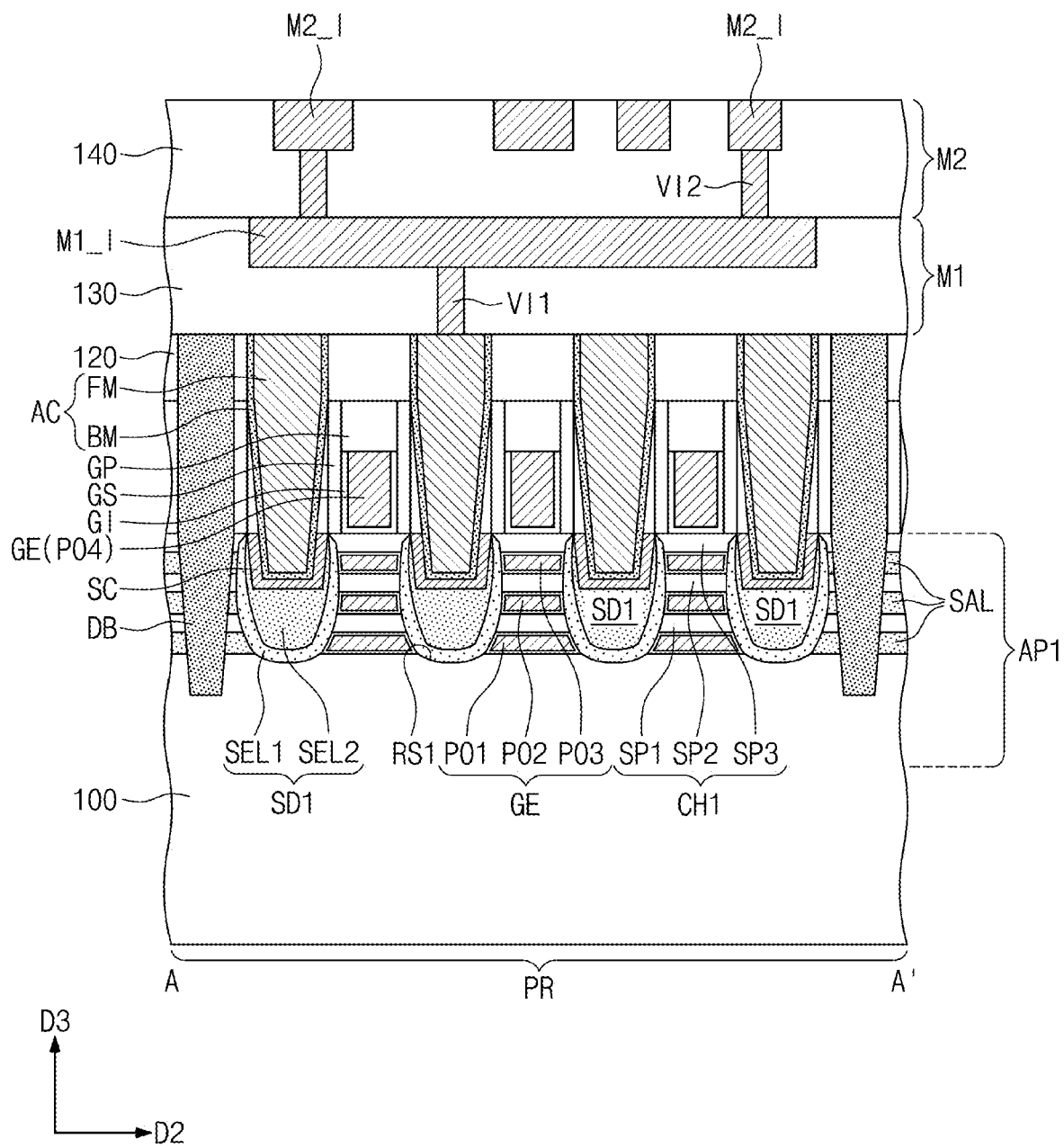
FIGS. 2A to 2D are sectional views, which are respectively taken along lines A-A', B-B', C-C', and D-D' of FIG. 1.
Figure 2B:
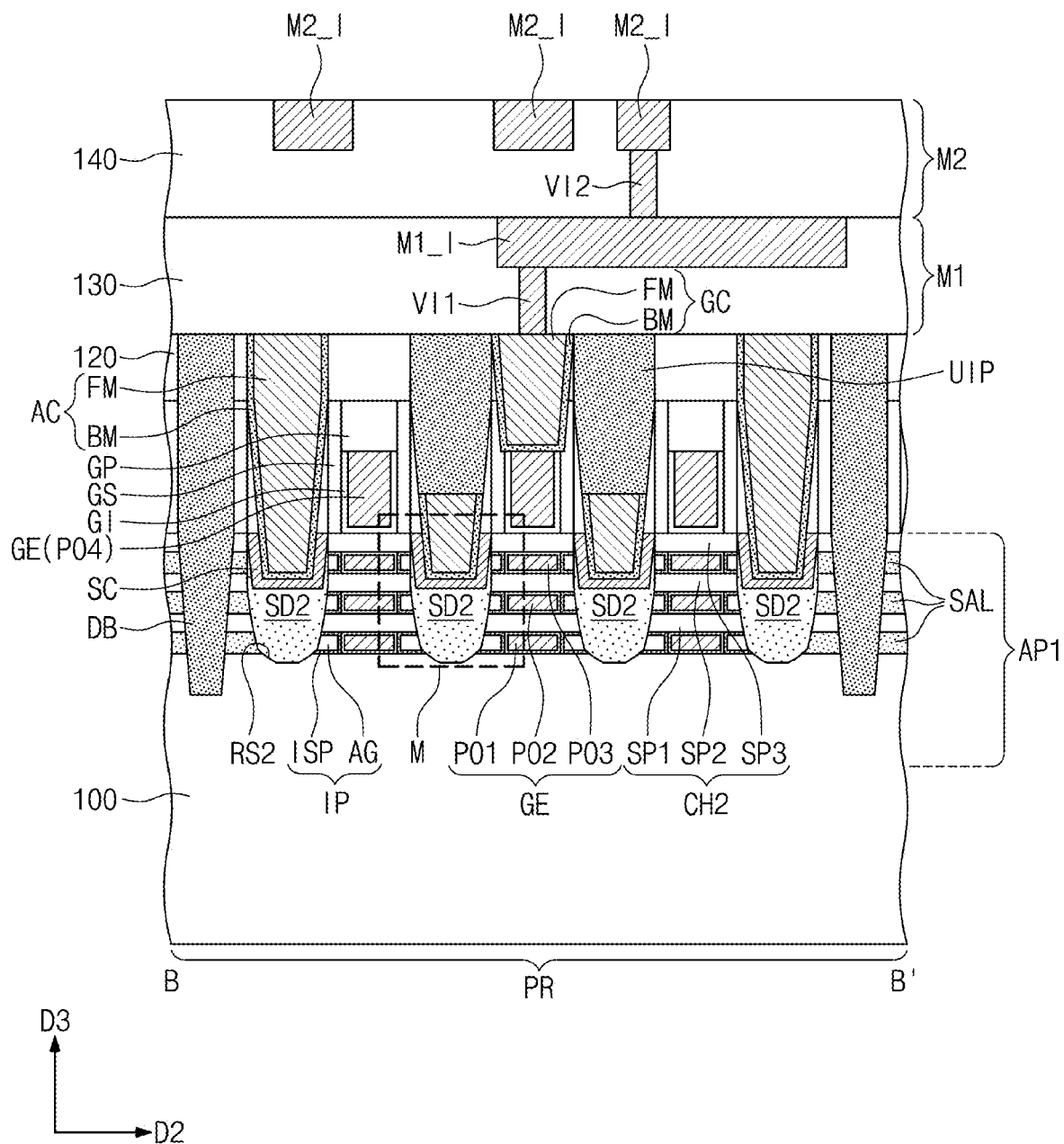
Figure 2C:
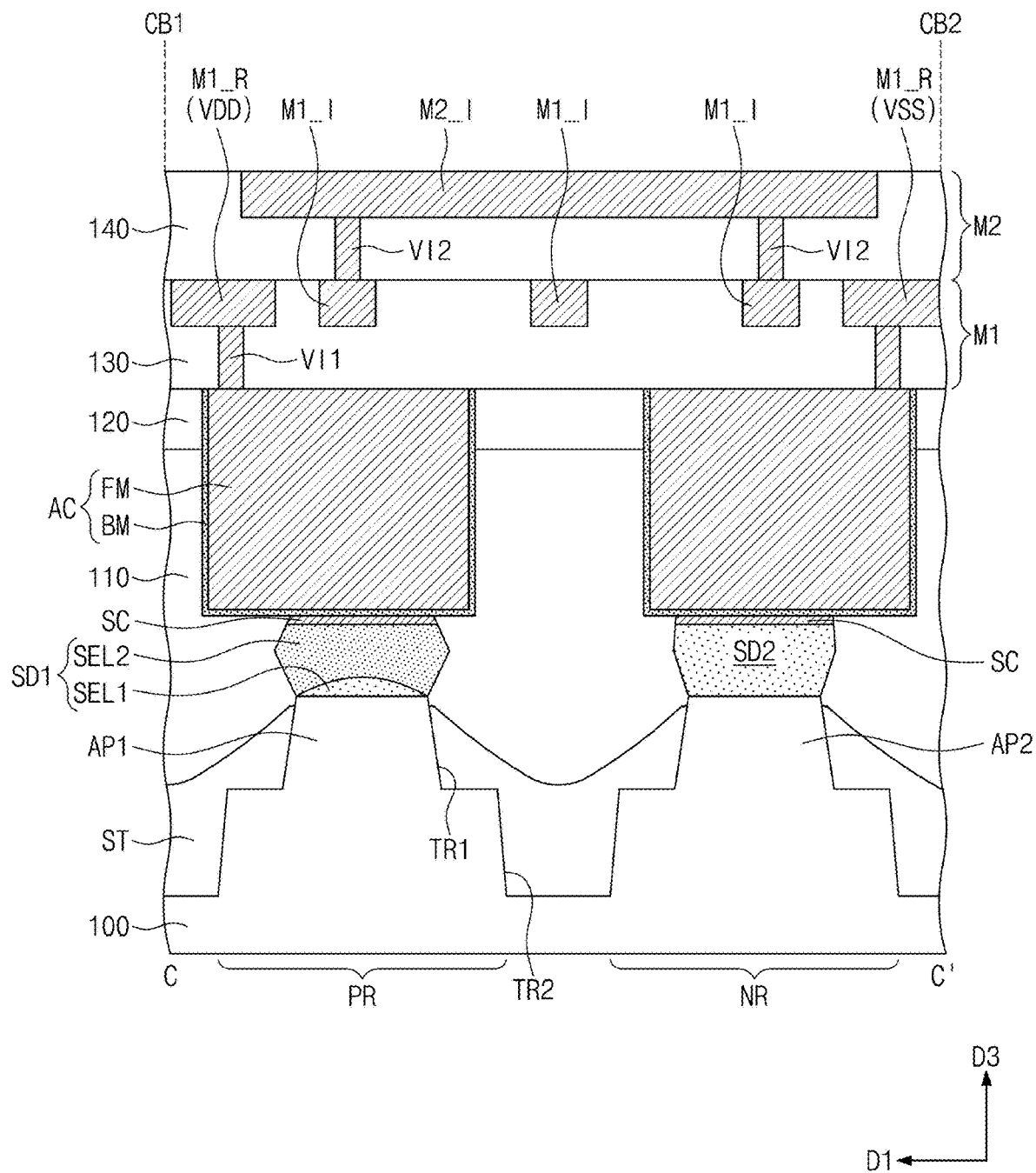
Figure 2D:
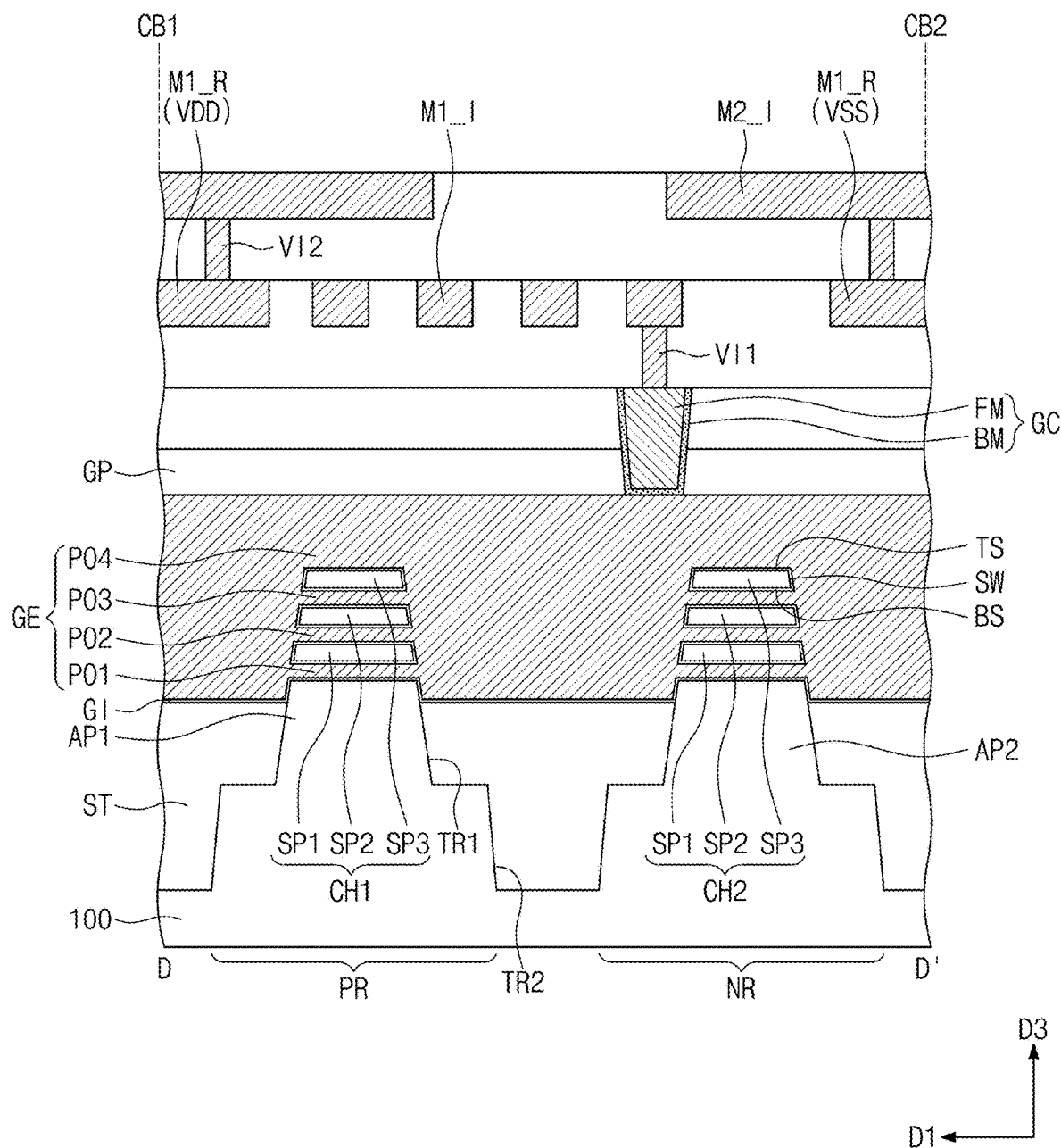
Figure 3:
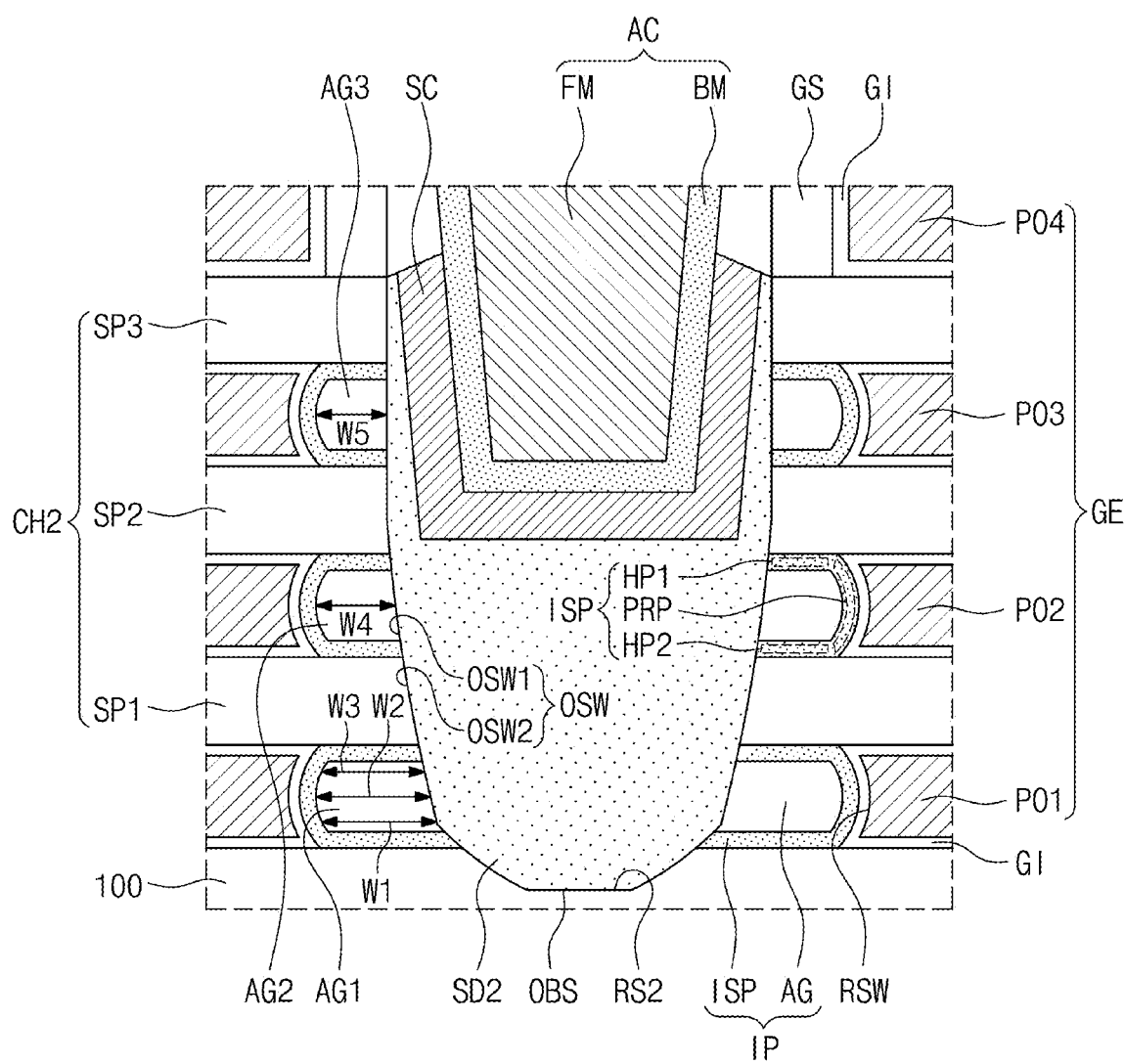
FIG. 3 is an enlarged sectional view illustrating a portion M of FIG. 2B.

FIG. 1 is a plan view illustrating a semiconductor device according to example embodiments of the inventive concepts. FIGS. 2A to 2D are sectional views, which are respectively taken along lines A-A', B-B', C-C', and D-D' of FIG. 1. FIG. 3 is an enlarged sectional view illustrating a portion M of FIG. 2B.

Referring to FIGS. 1 and 2A to 2D, a logic cell LC may be provided on a substrate 100. Logic transistors constituting a logic circuit may be disposed on the logic cell LC. The substrate 100 may be a semiconductor substrate, which is formed of or includes silicon, germanium, silicon-germanium, or the like, or a compound semiconductor substrate. As an example, the substrate 100 may be a silicon wafer.

The logic cell LC may include a PMOSFET region PR and an NMOSFET region NR. The PMOSFET and NMOSFET regions PR and NR may be defined by a second trench TR2, which is formed in an upper portion of the substrate 100. In other words, the second trench TR2 may be placed between the PMOSFET and NMOSFET regions PR and NR. The PMOSFET and NMOSFET regions PR and NR may be spaced apart from each other, in a first direction D1, with the second trench TR2 interposed therebetween.

A first active pattern AP1 and a second active pattern AP2 may be defined by a first trench TR1, which is formed in an upper portion of the substrate 100. The first and second active patterns AP1 and AP2 may be provided on the PMOSFET and NMOSFET regions PR and NR, respectively. The first trench TR1 may be shallower than the second trench TR2. The first and second active patterns AP1 and AP2 may be extended in a second direction D2. The first and second active patterns AP1 and AP2 may be vertically-protruding portions of the substrate 100.

A device isolation layer ST may be provided to fill the first and second trenches TR1 and TR2. The device isolation layer ST may include a silicon oxide layer. Upper portions of the first and second active patterns AP1 and AP2 may protrude vertically above the device isolation layer ST (e.g., see FIG. 2D). The device isolation layer ST may not cover the upper portions of the first and second active patterns AP1 and AP2. The device isolation layer ST may cover lower side surfaces of the first and second active patterns AP1 and AP2.

The first active pattern AP1 may include an upper portion serving as a first channel pattern CH1. The second active pattern AP2 may include an upper portion serving as a second channel pattern CH2. Each of the first and second channel patterns CH1 and CH2 may include a first semiconductor pattern SP1, a second semiconductor pattern SP2, and a third semiconductor pattern SP3, which are sequentially stacked. The first to third semiconductor patterns SP1, SP2, and SP3 may be spaced apart from each other in a vertical direction (e.g., a third direction D3).

Each of the first to third semiconductor patterns SP1, SP2, and SP3 may be formed of or include silicon (Si), germanium (Ge), or silicon-germanium (SiGe). In example embodiments, each of the first to third semiconductor patterns SP1, SP2, and SP3 may be formed of or include crystalline silicon.

A plurality of first recesses RS1 may be formed in the upper portion of the first active pattern AP1. First source/drain patterns SD1 may be provided in the first recesses RS1, respectively. The first source/drain patterns SD1 may be impurity regions of a first conductivity type (e.g., p-type). The first channel pattern CH1 may be interposed between each pair of the first source/drain patterns SD1. In other words, each pair of the first source/drain patterns SD1 may be connected to each other by the stacked first to third semiconductor patterns SP1, SP2, and SP3 of the first channel pattern CH1.

A plurality of second recesses RS2 may be formed in the upper portion of the second active pattern AP2. Second source/drain patterns SD2 may be provided in the second recesses RS2, respectively. The second source/drain patterns SD2 may be impurity regions of a second conductivity type (e.g., n-type). The second channel pattern CH2 may be interposed between each pair of the second source/drain patterns SD2. In other words, each pair of the second source/drain patterns SD2 may be connected to each other by the stacked first to third semiconductor patterns SP1, SP2, and SP3 of the second channel pattern CH2.

The first and second source/drain patterns SD1 and SD2 may be epitaxial patterns, which are formed by a selective epitaxial growth (SEG) process. As an example, each of the first and second source/drain patterns SD1 and SD2 may have a top surface that is located at the same or substantially the same level as a top surface of the third semiconductor pattern SP3. However, in example embodiments, the top surface of each of the first and second source/drain patterns SD1 and SD2 may be higher than the top surface of the third semiconductor pattern SP3.

The first source/drain patterns SD1 may include a semiconductor material (e.g., SiGe) having a lattice constant greater than that of the substrate 100. In some example embodiments, the pair of the first source/drain patterns SD1 may exert a compressive stress on the first channel patterns CH1 therebetween. The second source/drain patterns SD2 may be formed of or include the same semiconductor material (e.g., Si) as the substrate 100.

Each of the first source/drain patterns SD1 may include a first semiconductor layer SEL1 and a second semiconductor layer SEL2, which are sequentially stacked. A sectional shape of the first source/drain pattern SD1 taken parallel to the second direction D2 will be described with reference to FIG. 2A.

The first semiconductor layer SEL1 may cover an inner surface of a first recess RS1. The first semiconductor layer SEL1 may have a decreasing thickness in an upward direction. For example, the thickness of the first semiconductor layer SEL1, which is measured in the third direction D3 at the bottom level of the first recess RS1, may be larger than the thickness of the first semiconductor layer SEL1, which is measured in the second direction D2 at the top level of the first recess RS1. The first semiconductor layer SEL1 may have a 'U'-shaped section, due to a sectional profile of the first recess RS1.

The second semiconductor layer SEL2 may fill a remaining space of the first recess RS1 excluding the first semiconductor layer SELL A volume of the second semiconductor layer SEL2 may be larger than a volume of the first semiconductor layer SEL1. In other words, a ratio of a volume of the second semiconductor layer SEL2 to a total volume of the first source/drain pattern SD1 may be greater than a ratio of a volume of the first semiconductor layer SEL1 to the total volume of the first source/drain pattern SD1.

Each of the first and second semiconductor layers SEL1 and SEL2 may be formed of or include silicon-germanium (SiGe). In detail, the first semiconductor layer SEL1 may be provided to have a relatively low germanium concentration. In other example embodiments, the first semiconductor layer SEL1 may be provided to contain only silicon (Si) and not germanium (Ge). The germanium concentration of the first semiconductor layer SEL1 may range from 0 at % to 10 at %.

The second semiconductor layer SEL2 may be provided to have a relatively high germanium concentration. As an example, the germanium concentration of the second semiconductor layer SEL2 may range from 30 at % to 70 at %. The germanium concentration of the second semiconductor layer SEL2 may increase in the third direction D3. For example, the germanium concentration of the second semiconductor layer SEL2 may be about 40 at % near the first semiconductor layer SEL1 but may be about 60 at % at its top level.

The first and second semiconductor layers SEL1 and SEL2 may include impurities (e.g., boron), allowing the first source/drain pattern SD1 to have the p-type conductivity. In example embodiments, a concentration of impurities in the second semiconductor layer SEL2 (in at %) may be greater than that in the first semiconductor layer SEL1.

The first semiconductor layer SEL1 may reduce or prevent a stacking fault from occurring between the substrate 100 and the second semiconductor layer SEL2 and between the first to third semiconductor patterns SP1, SP2, and SP3 and the second semiconductor layer SEL2. The stacking fault may lead to an increase of a channel resistance. The stacking fault may easily occur on the bottom of the first recess RS1. Thus, if the first semiconductor layer SEL1 adjacent to the first recess RS1 is provided to have a relatively large thickness, the stacking fault may be reduced or prevented.

The first semiconductor layer SEL1 may protect the second semiconductor layer SEL2, in a process of replacing sacrificial layers SAL with first to third portions PO1, PO2, and PO3 of a gate electrode GE. For example, the first semiconductor layer SEL1 may reduce or prevent the second semiconductor layer SEL2 from being undesirably etched by an etching material, which is used to remove the sacrificial layers SAL.

The gate electrodes GE may be provided to cross the first and second active patterns AP1 and AP2 and to extend in the first direction D1. The gate electrodes GE may be arranged with a first pitch P1 in the second direction D2. Each of the gate electrodes GE may be overlapped with the first and second channel patterns CH1 and CH2 when viewed in a plan view.

The gate electrode GE may include a first portion PO1 interposed between the substrate 100 and the first semiconductor pattern SP1, a second portion PO2 interposed between the first semiconductor pattern SP1 and the second semiconductor pattern SP2, a third portion PO3 interposed between the second semiconductor pattern SP2 and the third semiconductor pattern SP3, and a fourth portion PO4 on the third semiconductor pattern SP3.

Referring back to FIG. 2A, the first to third portions PO1, PO2, and PO3 of the gate electrode GE on the PMOSFET region PR may have different widths from each other. For example, the largest width of the third portion PO3 in the second direction D2 may be larger than the largest width of the second portion PO2 in the second direction D2. The largest width of the first portion PO1 in the second direction D2 may be larger than the largest width of the third portion PO3 in the second direction D2.

Referring back to FIG. 2D, the gate electrode GE may be provided on a top surface TS, a bottom surface BS, and opposite side surfaces SW of each of the first to third semiconductor patterns SP1, SP2, and SP3. In other words, the logic transistor according to the present example embodiments may be a three-dimensional field-effect transistor (e.g., multi-bridge channel field-effect transistor (MBCFET)), in which the gate electrode GE is provided to three-dimensionally surround the channel pattern.

Referring back to FIGS. 1 and 2A to 2D, a pair of gate spacers GS may be respectively disposed on opposite side surfaces of the fourth portion PO4 of the gate electrode GE. The gate spacers GS may be extended along the gate electrode GE and in the first direction D1. Top surfaces of the gate spacers GS may be higher than a top surface of the gate electrode GE. The top surfaces of the gate spacers GS may be coplanar with a top surface of a first interlayer insulating layer 110, which will be described below. The gate spacers GS may be formed of or include at least one of SiCN, SiCON, or SiN. In example embodiments, the gate spacers GS may have a multi-layered structure including at least two layers, each of which is made of SiCN, SiCON, or SiN.

A gate capping pattern GP may be provided on the gate electrode GE. The gate capping pattern GP may be extended along the gate electrode GE and in the first direction D1. The gate capping pattern GP may be formed of or include a material having an etch selectivity with respect to first and second interlayer insulating layers 110 and 120, which will be described below. For example, the gate capping patterns GP may be formed of or include at least one of SiON, SiCN, SiCON, or SiN.

A gate insulating layer GI may be interposed between the gate electrode GE and the first channel pattern CH1 and between the gate electrode GE and the second channel pattern CH2. The gate insulating layer GI may cover the top surface TS, the bottom surface BS, and the opposite side surfaces SW of each of the first to third semiconductor patterns SP1, SP2, and SP3. The gate insulating layer GI may cover the top surface of the device isolation layer ST below the gate electrode GE (e.g., see FIG. 2D).

In example embodiments, the gate insulating layer GI may include a silicon oxide layer, a silicon oxynitride layer, and/or a high-k dielectric layer. The high-k dielectric layer may be formed of or include at least one of high-k dielectric materials whose dielectric constants are higher than that of silicon oxide. As an example, the high-k dielectric materials may be formed of or include at least one of hafnium oxide, hafnium silicon oxide, hafnium zirconium oxide, hafnium tantalum oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, and/or lead zinc niobate.

In other example embodiments, the semiconductor device may include a negative capacitance (NC) FET using a negative capacitor. For example, the gate insulating layer GI may include a ferroelectric layer exhibiting a ferroelectric material property and a paraelectric layer exhibiting a paraelectric material property.

The ferroelectric layer may have a negative capacitance, and the paraelectric layer may have a positive capacitance. In example embodiments where two or more capacitors are connected in series and each capacitor has a positive capacitance, a total capacitance may be less than a capacitance of each of the capacitors. By contrast, in example embodiments where at least one of serially-connected capacitors has a negative capacitance, a total capacitance of the serially-connected capacitors may have a positive value and may be greater than an absolute value of each capacitance.

In example embodiments where a ferroelectric layer having a negative capacitance and a paraelectric layer having a positive capacitance are connected in series, a total capacitance of the serially-connected ferroelectric and paraelectric layers may be increased. Due to such an increase of the total capacitance, a transistor including the ferroelectric layer may have a subthreshold swing (SS) less than 60 mV/decade, at the room temperature.

The ferroelectric layer may have a ferroelectric material property. The ferroelectric layer may be formed of or include at least one of, for example, hafnium oxide, hafnium zirconium oxide, barium strontium titanium oxide, barium titanium oxide, and/or lead zirconium titanium oxide. Here, the hafnium zirconium oxide may be hafnium oxide that is doped with zirconium (Zr). Alternatively, the hafnium zirconium oxide may be a compound composed of hafnium (Hf), zirconium (Zr), and/or oxygen (O).

The ferroelectric layer may further include dopants. For example, the dopants may include at least one of aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr), and/or tin (Sn). The kind of the dopants in the ferroelectric layer may vary depending on a ferroelectric material included in the ferroelectric layer.

In example embodiments where the ferroelectric layer includes hafnium oxide, the dopants in the ferroelectric layer may include at least one of, for example, gadolinium (Gd), silicon (Si), zirconium (Zr), aluminum (Al), and/or yttrium (Y).

In example embodiments where the dopants are aluminum (Al), a content of aluminum in the ferroelectric layer may range from 3 to 8 at % (atomic percentage). Here, the content of the aluminum as the dopants may be a ratio of the number of aluminum atoms to the number of hafnium and aluminum atoms.

In example embodiments where the dopants are silicon (Si), a content of silicon in the ferroelectric layer may range from 2 at % to 10 at %. In example embodiments where the dopants are yttrium (Y), a content of yttrium in the ferroelectric layer may range from 2 at % to 10 at %. In example embodiments where the dopants are gadolinium (Gd), a content of gadolinium in the ferroelectric layer may range from 1 at % to 7 at %. In example embodiments where the dopants are zirconium (Zr), a content of zirconium in the ferroelectric layer may range from 50 at % to 80 at %.

The paraelectric layer may have a paraelectric property. The paraelectric layer may be formed of or include at least one of, for example, silicon oxide and/or high-k metal oxides. The metal oxides, which can be used as the paraelectric layer, may include at least one of, for example, hafnium oxide, zirconium oxide, and/or aluminum oxide, but the inventive concepts are not limited to these examples.

The ferroelectric layer and the paraelectric layer may be formed of or include the same material. The ferroelectric layer may have the ferroelectric material property, but the paraelectric layer may not have the ferroelectric material property. For example, in example embodiments where the ferroelectric and paraelectric layers contain hafnium oxide, a crystal structure of the hafnium oxide in the ferroelectric layer may be different from a crystal structure of the hafnium oxide in the paraelectric layer.

The ferroelectric layer may exhibit the ferroelectric material property, only when it is in a specific range of thickness. In example embodiments, the ferroelectric layer may have a thickness ranging from 0.5 to 10 nm, but the inventive concepts are not limited to this example. Since a critical thickness associated with the occurrence of the ferroelectric material property varies depending on the kind of the ferroelectric material, the thickness of the ferroelectric layer may be changed depending on the kind of the ferroelectric material.

As an example, the gate insulating layer GI may include a single ferroelectric layer. As another example, the gate insulating layer GI may include a plurality of ferroelectric layers spaced apart from each other. The gate insulating layer GI may have a multi-layered structure, in which a plurality of ferroelectric layers and a plurality of paraelectric layers are alternately stacked.

The gate electrode GE may include a first metal pattern and a second metal pattern on the first metal pattern. The first metal pattern may be provided on the gate insulating layer GI and may be adjacent to the first to third semiconductor patterns SP1, SP2, and SP3. The first metal pattern may include a work function metal, which can be used to adjust a threshold voltage of the transistor. By adjusting a thickness and composition of the first metal pattern, it may be possible to realize a transistor having a desired threshold voltage. For example, the first to third portions PO1, PO2, and PO3 of the gate electrode GE may be composed of the first metal pattern or the work function metal.

The first metal pattern may include a metal nitride layer. For example, the first metal pattern may include at least one metal, which is selected from the group consisting of titanium (Ti), tantalum (Ta), aluminum (Al), tungsten (W) and molybdenum (Mo), and nitrogen (N). In example embodiments, the first metal pattern may further include carbon (C). The first metal pattern may include a plurality of work function metal layers, which are stacked.

The second metal pattern may include a metallic material whose resistance is lower than the first metal pattern. For example, the second metal pattern may include at least one metal selected from the group consisting of tungsten (W), aluminum (Al), titanium (Ti), and tantalum (Ta). For example, the fourth portion PO4 of the gate electrode GE may include the first metal pattern and the second metal pattern on the first metal pattern.

Referring back to FIG. 2B, inner spacers IP may be provided on the NMOSFET region NR. Each of the inner spacers IP may be interposed between the second source/ drain pattern SD2 and a corresponding one of the first to third portions PO1, PO2, and PO3 of the gate electrode GE. The inner spacers IP may be in direct contact with the second source/drain pattern SD2. Each of the first to third portions PO1, PO2, and PO3 of the gate electrode GE may be spaced apart from the second source/drain pattern SD2 by the inner spacer IP. The inner spacer IP will be described in more detail with reference to FIG. 3.

A first interlayer insulating layer 110 may be provided on the substrate 100. The first interlayer insulating layer 110 may cover the gate spacers GS and the first and second source/drain patterns SD1 and SD2. The first interlayer insulating layer 110 may have a top surface that is substantially coplanar with the top surface of the gate capping pattern GP and the top surface of the gate spacer GS. A second interlayer insulating layer 120 may be formed on the first interlayer insulating layer 110 to cover the gate capping pattern GP. In example embodiments, at least one of the first and second interlayer insulating layers 110 and 120 may include a silicon oxide layer.

A pair of dividing structures DB, which are opposite to each other in the second direction D2, may be provided at both sides of the logic cell LC. The dividing structure DB may be extended in the first direction D1 and parallel to the gate electrodes GE. A pitch between the dividing structure DB and the gate electrode GE adjacent to each other may be equal to the first pitch P1.

The dividing structure DB may be provided to penetrate the first and second interlayer insulating layers 110 and 120 and may be extended into the first and second active patterns AP1 and AP2. The dividing structure DB may penetrate an upper portion of each of the first and second active patterns AP1 and AP2. The dividing structure DB may separate the PMOSFET and NMOSFET regions PR and NR of the logic cell LC from an active region of another logic cell adjacent thereto.

The upper portion of each of the first and second active patterns AP1 and AP2 may further include sacrificial layers SAL adjacent to the dividing structure DB. The sacrificial layers SAL may be stacked to be spaced apart from each other. Each of the sacrificial layers SAL may be located at the same level as a corresponding one of the first to third portions PO1, PO2, and PO3 of the gate electrode GE. The dividing structure DB may be provided to penetrate the sacrificial layers SAL.

The sacrificial layers SAL may be formed of or include silicon-germanium (SiGe). A germanium concentration of each of the sacrificial layers SAL may range from 10 at % to 30 at %. The germanium concentration of the sacrificial layer SAL may be higher than the germanium concentration of the first semiconductor layer SEL1 described above.

Active contacts AC may be provided to penetrate the first and second interlayer insulating layers 110 and 120 and may be electrically connected to the first and second source/drain patterns SD1 and SD2, respectively. A pair of the active contacts AC may be respectively provided at both sides of the gate electrode GE. When viewed in a plan view, the active contact AC may have a bar shape elongated in the first direction D1.

The active contact AC may be a self-aligned contact. For example, the active contact AC may be formed by a self-alignment process using the gate capping pattern GP and the gate spacer GS. In example embodiments, the active contact AC may cover at least a portion of a side surface of the gate spacer GS. Although not shown, the active contact AC may be provided to cover a portion of the top surface of the gate capping pattern GP.

Silicide patterns SC may be respectively interposed between the active contact AC and the first source/drain pattern SD1 and between the active contact AC and the second source/drain pattern SD2. The active contact AC may be electrically connected to the source/drain pattern SD1 or SD2 through the silicide pattern SC. The silicide pattern SC may be formed of or include at least one of metal silicide materials (e.g., titanium silicide, tantalum silicide, tungsten silicide, nickel silicide, and cobalt silicide).

A gate contact GC, which is electrically connected to the gate electrode GE, may be provided to penetrate the second interlayer insulating layer 120 and the gate capping pattern GP. Referring to FIG. 2B, an upper region of each of the active contacts AC adjacent to the gate contact GC may be filled with an upper insulating pattern UIP. Accordingly, it may be possible to reduce or prevent a process failure (e.g., a short circuit), which may occur when the gate contact GC is in contact with the active contact AC adjacent thereto.

Each of the active and gate contacts AC and GC may include a conductive pattern FM and a barrier pattern BM enclosing the conductive pattern FM. For example, the conductive pattern FM may be formed of or include at least one metal of aluminum, copper, tungsten, molybdenum, or cobalt. The barrier pattern BM may be provided to cover side and bottom surfaces of the conductive pattern FM. In example embodiments, the barrier pattern BM may include a metal layer and a metal nitride layer. The metal layer may be formed of or include at least one of titanium, tantalum, tungsten, nickel, cobalt, or platinum. The metal nitride layer may include at least one of titanium nitride (TiN), tantalum nitride (TaN), tungsten nitride (WN), nickel nitride (NiN), cobalt nitride (CoN), or platinum nitride (PtN).

A first metal layer M1 may be provided in a third interlayer insulating layer 130. The first metal layer M1 may include first lower interconnection lines M1_R, second lower interconnection lines M1_I, and lower vias VI1. The lower vias VI1 may be provided below the first and second lower interconnection lines M1_R and M1_I.

Each of the first lower interconnection lines M1_R may be extended in the second direction D2 to cross the logic cell LC. Each of the first lower interconnection lines M1_R may be a power line. For example, a drain voltage VDD or a source voltage VSS may be applied to the first lower interconnection line M1_R.

Referring to FIG. 1, a first cell boundary CB1 extending in the second direction D2 may be defined in a region of the logic cell LC. A second cell boundary CB2 extending in the second direction D2 may be defined in a region of the logic cell LC opposite to the first cell boundary CB1. The first lower interconnection line M1_R, to which the drain voltage VDD (e.g., a power voltage) is applied, may be disposed on the first cell boundary CB1. The first lower interconnection line M1_R, to which the drain voltage VDD is applied, may be extended along the first cell boundary CB1 and in the second direction D2. The first lower interconnection line M1_R, to which the source voltage VSS (e.g., a ground voltage) is applied, may be disposed on the second cell boundary CB2. The first lower interconnection line M1_R, to which the source voltage VSS is applied, may be extended along the second cell boundary CB2 and in the second direction D2.

The second lower interconnection lines M1_I may be disposed between the first lower interconnection lines M1_R, to which the drain voltage VDD and the source voltage VSS are respectively applied, in the first direction D1. Each of the second lower interconnection lines M1_I may be a line- or bar-shaped pattern extending in the second direction D2. The second lower interconnection lines M1_I may be arranged to be spaced apart from each other with a second pitch P2 in the first direction D1. The second pitch P2 may be smaller than the first pitch P1.

The lower vias VI1 may be provided below the first and second lower interconnection lines M1_R and M1_I of the first metal layer M1. The lower vias VI1 may be respectively interposed between the active contacts AC and the first and second lower interconnection lines M1_R and MU. The lower vias VI1 may be respectively interposed between the gate contacts GC and the second lower interconnection lines MU.

The lower interconnection line M1_R or M1_I of the first metal layer M1 and the lower via VI1 thereunder may be formed by separate processes. In other words, each of the lower interconnection line M1_R or M1_I and the lower via VI1 may be a single damascene process. The semiconductor device according to the present example embodiments may be fabricated using a sub-20 nm process.

A second metal layer M2 may be provided in a fourth interlayer insulating layer 140. The second metal layer M2 may include upper interconnection lines M2_I. Each of the upper interconnection lines M2_I may be a line- or bar-shaped pattern extending in the first direction D1. In other words, the upper interconnection lines M2_I may be extended in the first direction D1 to be parallel to each other. When viewed in a plan view, the upper interconnection lines M2_I may be parallel to the gate electrodes GE. The upper interconnection lines M2_I may be arranged with a third pitch P3 in the second direction D2. The third pitch P3 may be smaller than the first pitch P1. The third pitch P3 may be larger than the second pitch P2.

The second metal layer M2 may further include upper vias VI2. The upper vias VI2 may be provided below the upper interconnection lines M2_I. The upper vias VI2 may be respectively interposed between the lower interconnection lines M1_R and M1_I and the upper interconnection lines M2_I.

The upper interconnection line M2_I of the second metal layer M2 and the upper via VI2 thereunder may be formed by the same process and may form a single object. In other words, the upper interconnection line M2_I of the second metal layer M2 and the upper via VI2 may be formed by a dual damascene process.

The lower interconnection lines M1_R and M1_I of the first metal layer M1 and the upper interconnection lines M2_I of the second metal layer M2 may be formed of or include the same material or different conductive materials. For example, the lower interconnection lines M1_R and M1_I and the upper interconnection lines M2_I may be formed of or include at least one of metallic materials (e.g., aluminum, copper, tungsten, molybdenum, or cobalt).

In example embodiments, although not shown, additional metal layers (e.g., M3, M4, M5, and so forth) may be further stacked on the fourth interlayer insulating layer 140. Each of the stacked metal layers may include routing lines.

Now, the inner spacers IP on the NMOSFET region NR will be described in more detail with reference to FIG. 3. The inner spacers IP may be respectively interposed between the first to third portions PO1, PO2, and PO3 of the gate electrode GE and the second source/drain pattern SD2. Each of the inner spacers IP may include an inner insulating pattern ISP and an air gap AG.

Each of the first to third portions PO1, PO2, and PO3 of the gate electrode GE may include a recessed side surface RSW. The recessed side surface RSW may be recessed in a direction away from the second source/drain pattern SD2.

The inner insulating pattern ISP may be provided to be adjacent to the recessed side surface RSW and may face the recessed side surface RSW. The gate insulating layer GI may be interposed between the inner insulating pattern ISP and the recessed side surface RSW.

The inner insulating pattern ISP may have the shape of letter 'C'. Specifically, the inner insulating pattern ISP may include a first horizontally-extended portion HP1 and a second horizontally-extended portion HP2, which are respectively provided at top and bottom levels of the inner spacer IP, and a protruding portion PRP, which is provided to connect the first and second horizontally-extended portions HP1 and HP2 to each other. Each of the first and second horizontally-extended portions HP1 and HP2 may be extended in the second direction D2. Each of the first and second horizontally-extended portions HP1 and HP2 may be in direct contact with the semiconductor pattern SP1, SP2, or SP3.

As an example, the first and second horizontally-extended portions HP1 and HP2 of the inner insulating pattern ISP may have different lengths in the second direction D2. The second horizontally-extended portion HP2 may be longer than the first horizontally-extended portion HP1.

The protruding portion PRP may be extended in the third direction D3 to connect the first and second horizontally-extended portions HP1 and HP2 to each other. The protruding portion PRP may be provided to face the recessed side surface RSW. The protruding portion PRP may have a profile corresponding to the recessed side surface RSW. In other words, the protruding portion PRP may protrude in a direction away from the second source/drain pattern SD2. The protruding portion PRP may protrude toward the portion PO1, PO2, or PO3 of the gate electrode GE.

A side surface OSW of the second source/drain pattern SD2 may include a first side surface OSW1 and a second side surface OSW2. The first side surface OSW1 may be in contact with the air gap AG, and the second side surface OSW2 may be in contact with the semiconductor pattern SP1, SP2, or SP3. A bottom surface OBS of the second source/drain pattern SD2 may be in contact with a bottom of the second recess RS2 (e.g., the substrate 100).

The inner insulating pattern ISP may be formed of or include at least one of low-k dielectric materials. The low-k dielectric materials may include silicon oxide or dielectric materials whose dielectric constants are lower than that of silicon oxide. For example, the low-k dielectric materials may include silicon oxide, fluorine- or carbon-doped silicon oxide, porous silicon oxide, or organic polymeric dielectric materials.

The air gap AG may be interposed between the inner insulating pattern ISP and the second source/drain pattern SD2. The air gap AG may be enclosed by the first and second horizontally-extended portions HP1 and HP2, the protruding portion PRP, and the first side surface OSW1. The air gap AG may be an empty space, which is defined by the first and second horizontally-extended portions HP1 and HP2, the protruding portion PRP, and the first side surface OSW1. The air gap AG may be filled with the air or a gaseous substance.

The air gap AG may include a first air gap AG1 between the substrate 100 and the first semiconductor pattern SP1, a second air gap AG2 between the first semiconductor pattern SP1 and the second semiconductor pattern SP2, and a third air gap AG3 between the second semiconductor pattern SP2 and the third semiconductor pattern SP3.

In example embodiments, a width of the first air gap AG1 in the second direction D2 may vary in the third direction D3. Specifically, the width of the first air gap AG1 may be increased in the third direction D3 until it reaches its largest value, and then may be decreased. The first air gap AG1 may have a first width W1 at its bottom level, a second width W2 at its intermediate level, and a third width W3 at its top level. The second width W2 may be larger than the first width W1, and the first width W1 may be larger than the third width W3. That is, the width of the first air gap AG1 may have the largest width W2 at its intermediate level.

The largest width of the second air gap AG2 may be a fourth width W4, and the largest width of the third air gap AG3 may be a fifth width W5. The largest widths of the first to third air gaps AG1, AG2, and AG3 may be different from each other. For example, the largest width W2 of the first air gap AG1 may be larger than the largest width W4 of the second air gap AG2, and the largest width W4 of the second air gap AG2 may be larger than the largest width W5 of the third air gap AG3. That is, the largest widths of the first to third air gaps AG1, AG2, and AG3 may be gradually decreased in the third direction D3.

According to the present example embodiments, the air gap AG may have a volume that is larger than that of the inner spacer IP. In other words, a volume fraction of the air gap AG in the inner spacer IP may be greater than a volume fraction of the inner insulating pattern ISP in the inner spacer IP. Thus, a dielectric constant of the inner spacer IP may be mainly determined by the air gap AG. As a result, the dielectric constant of the inner spacer IP may be lowered to a value close to the dielectric constant of the air.

Due to the dielectric material (e.g., the inner spacer IP) interposed between the gate electrode GE and the second source/drain pattern SD2, a parasitic capacitor may be formed between the gate electrode GE and the second source/drain pattern SD2. The presence of the parasitic capacitor may lead to deterioration in performance and electric characteristics of the semiconductor device.

According to example embodiments of the inventive concepts, the inner spacer IP may have a very low dielectric constant, because it is provided as a combination of the inner insulating pattern ISP, which is formed of a low-k dielectric material, and the air gap AG. Due to the low dielectric constant of the inner spacer IP, the parasitic capacitor between the gate electrode GE and the second source/drain pattern SD2 may have low capacitance. Accordingly, the semiconductor device according to example embodiments of the inventive concepts may be provided to have improved performance and electric characteristics.

FIGS. 4A to 10D are sectional views illustrating a method of fabricating a semiconductor device according to example embodiments of the inventive concepts. Specifically, FIGS. 4A, 5A, 6A, 7A, 8A, 9A, and 10A are sectional views corresponding to the line A-A' of FIG. 1. FIGS. 6B, 7B, 8B, 9B, and 10B are sectional views corresponding to the line B-B' of FIG. 1. FIGS. 6C, 7C, 8C, 9C, and 10C are sectional views corresponding to the line C-C' of FIG. 1. FIGS. 4B, 5B, 6D, 7D, 8D, 9D, and 10D are sectional views corresponding to the line D-D' of FIG. 1. FIGS. 11 to 19 are sectional views illustrating a portion M of FIGS. 6B and 7B and illustrating a method of forming an inner spacer according to example embodiments of the inventive concepts.

Figure 4A:
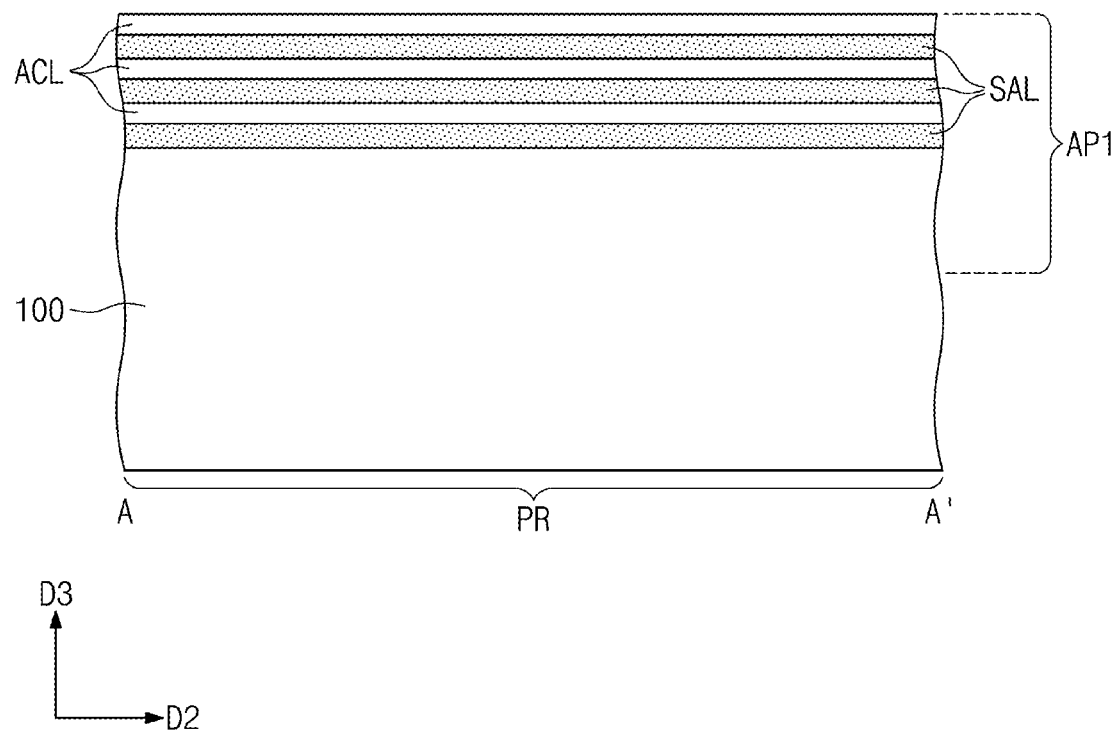
FIGS. 4A to 10D are sectional views illustrating a method of fabricating a semiconductor device according to example embodiments of the inventive concepts.
Figure 4B:
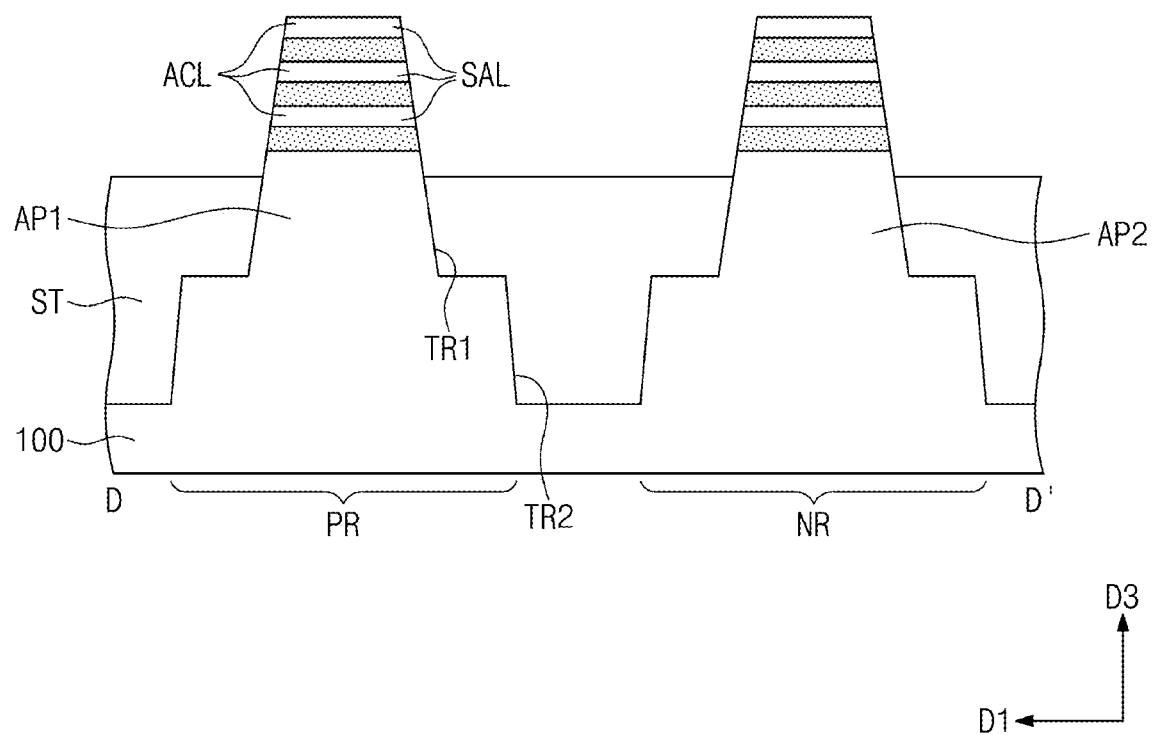

Referring to FIGS. 4A and 4B, a substrate 100 including a PMOSFET region PR and an NMOSFET region NR may be provided. Sacrificial layers SAL and active layers ACL, which are alternately stacked on the substrate 100, may be formed. The sacrificial layers SAL may be formed of or include at least one of silicon (Si), germanium (Ge), or silicon-germanium (SiGe), and the active layers ACL may be formed of or include at least one of silicon (Si), germanium (Ge), or silicon-germanium (SiGe).

For example, the sacrificial layers SAL may be formed of or include silicon-germanium (SiGe), and the active layers ACL may be formed of or include silicon (Si). A germanium concentration of each of the sacrificial layers SAL may range from 10 at % to 30 at %.

Mask patterns may be respectively formed on the PMOSFET region PR and the NMOSFET region NR of the substrate 100. The mask pattern may be a line- or bar-shaped pattern extending in a second direction D2.

A first patterning process, in which the mask patterns are used as an etch mask, may be performed to form a first trench TR1 defining a first active pattern AP1 and a second active pattern AP2. The first active pattern AP1 and the second active pattern AP2 may be formed on the PMOSFET region PR and the NMOSFET region NR, respectively. Each of the first and second active patterns AP1 and AP2 may include the sacrificial layers SAL and the active layers ACL, which are alternately stacked in an upper portion thereof.

A second patterning process may be performed on the substrate 100 to form a second trench TR2 defining the PMOSFET region PR and the NMOSFET region NR. The second trench TR2 may be formed to be deeper than the first trench TR1.

A device isolation layer ST may be formed on the substrate 100 to fill the first and second trenches TR1 and TR2. For example, an insulating layer may be formed on the substrate 100 to cover the first and second active patterns AP1 and AP2. The device isolation layer ST may be formed by recessing the insulating layer until the sacrificial layers SAL are exposed.

The device isolation layer ST may be formed of or include an insulating material (e.g., silicon oxide). Each of the first and second active patterns AP1 and AP2 may include an upper portion protruding above the device isolation layer ST. For example, the upper portion of each of the first and second active patterns AP1 and AP2 may vertically protrude above the device isolation layer ST.

Figure 5A:
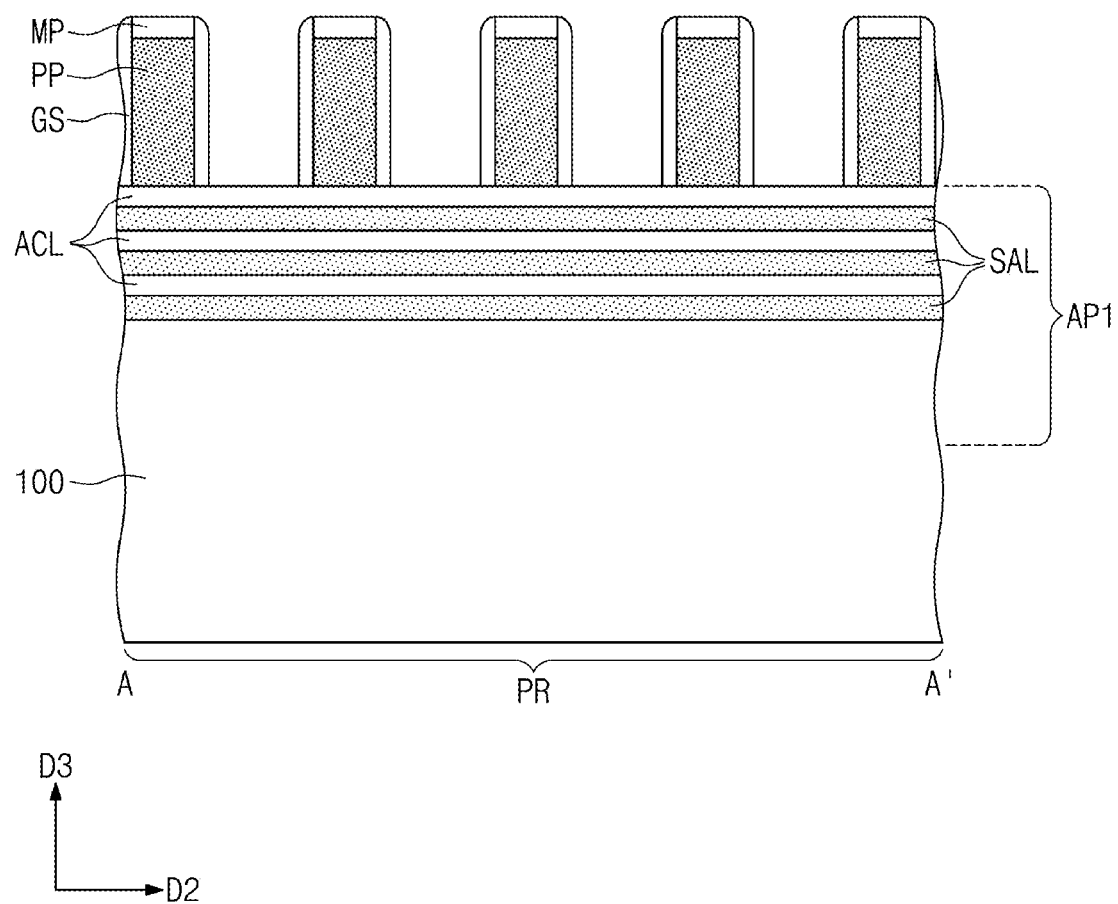
Figure 5B:
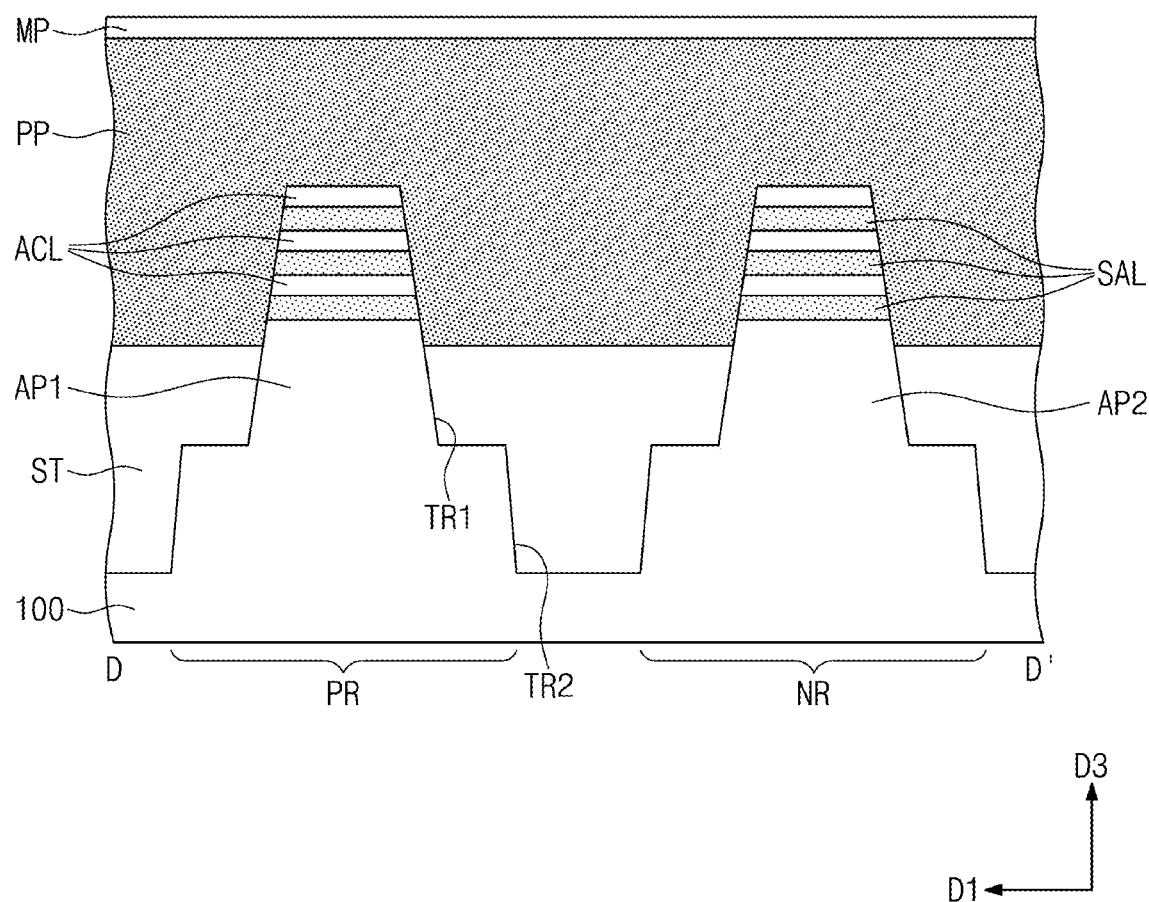
Figure 6A:
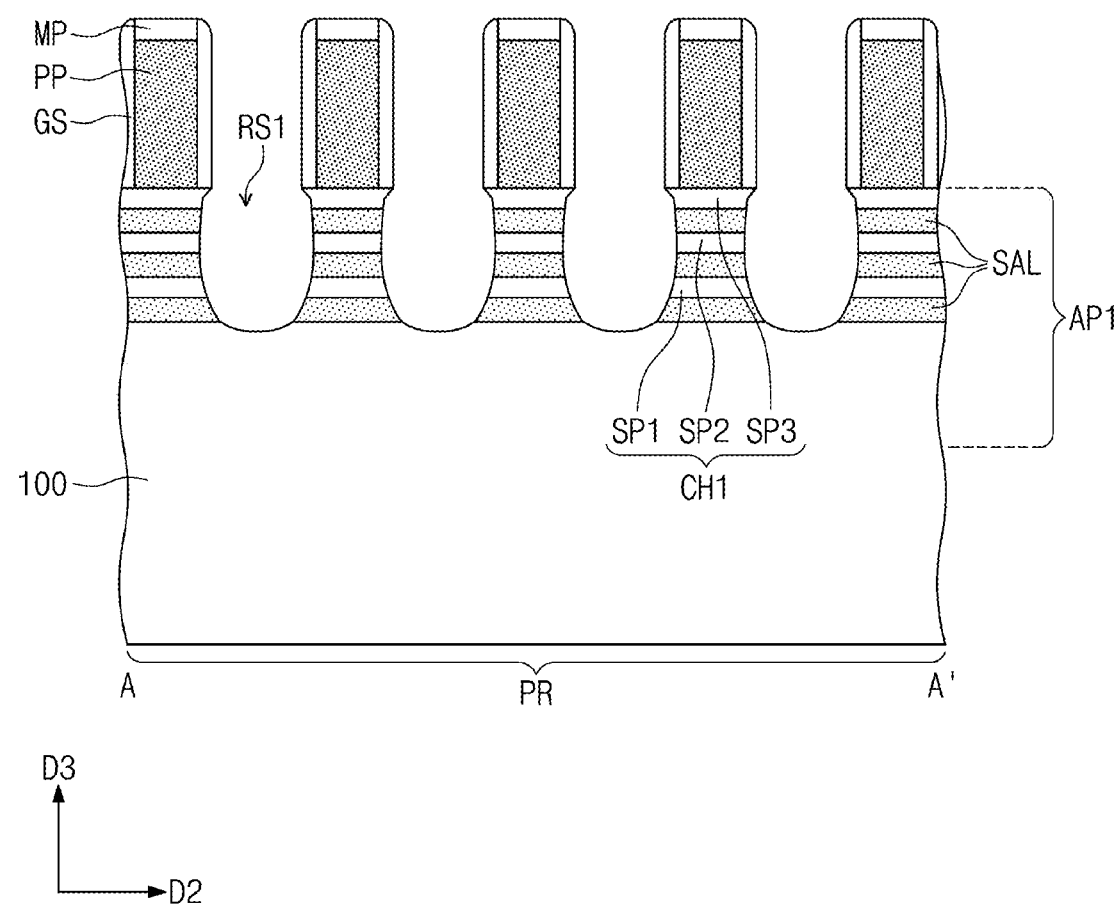
Figure 6B:
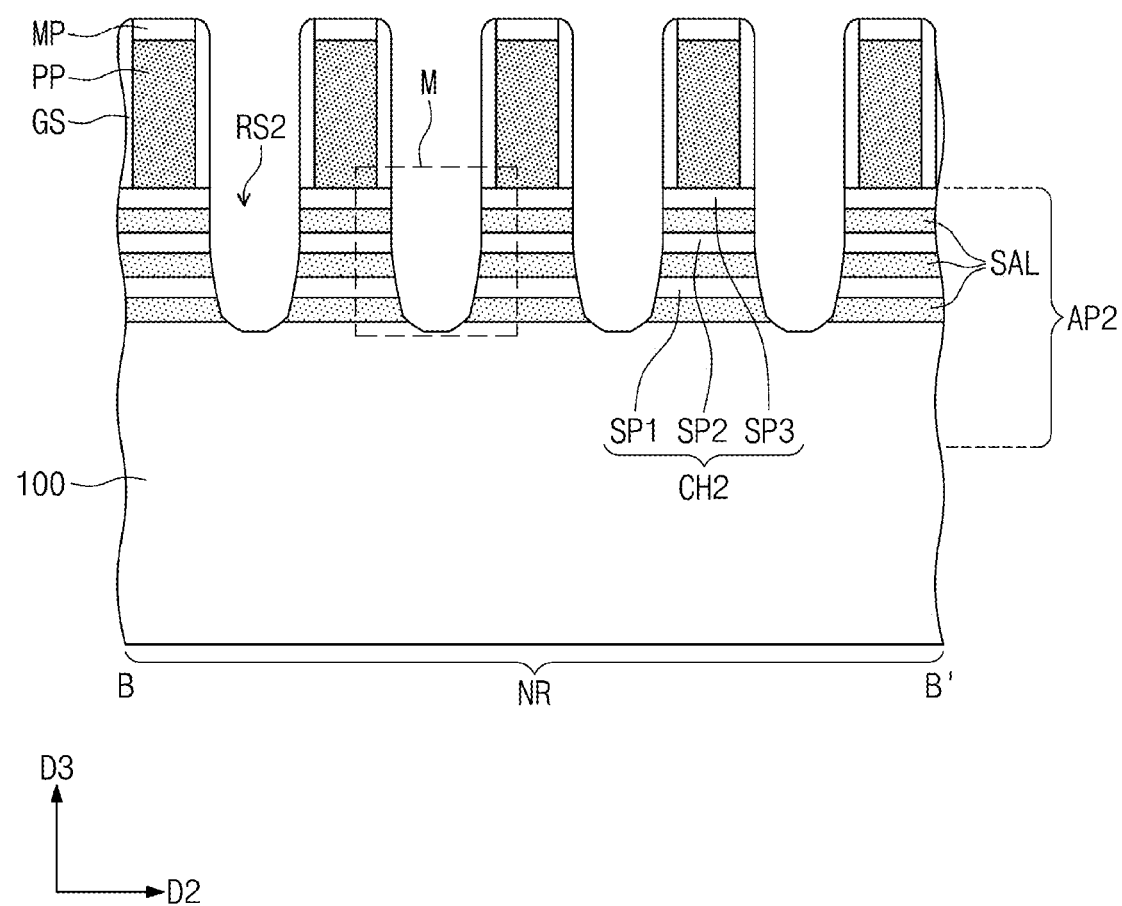
Figure 6C:
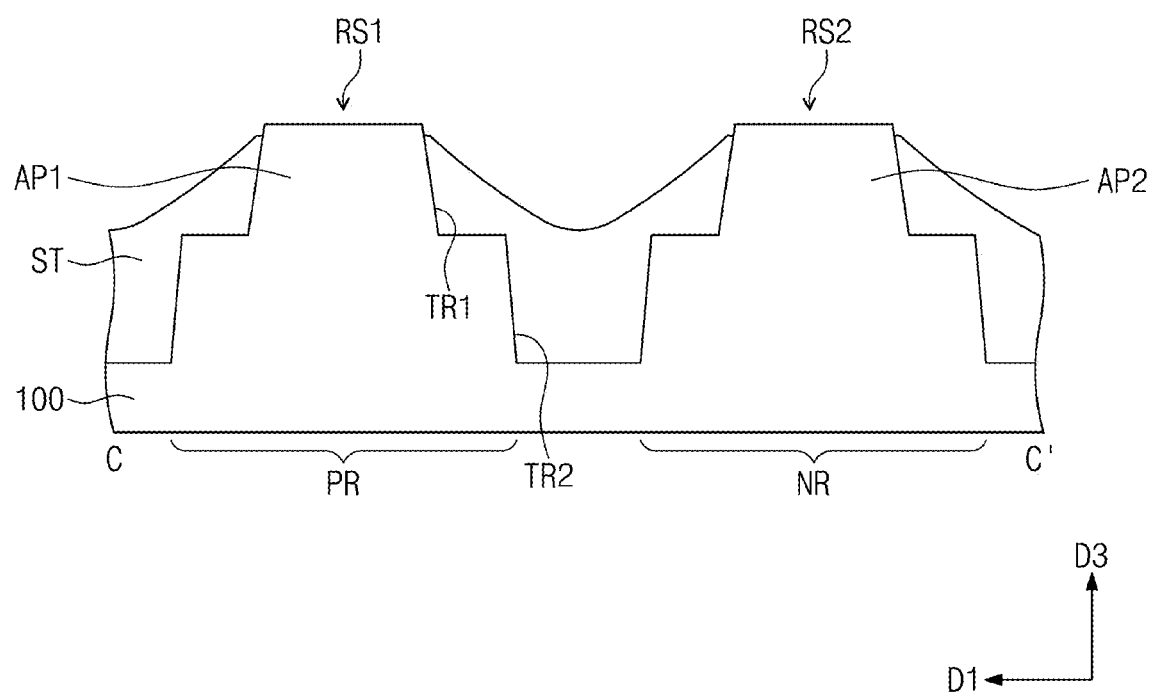
Figure 6D:
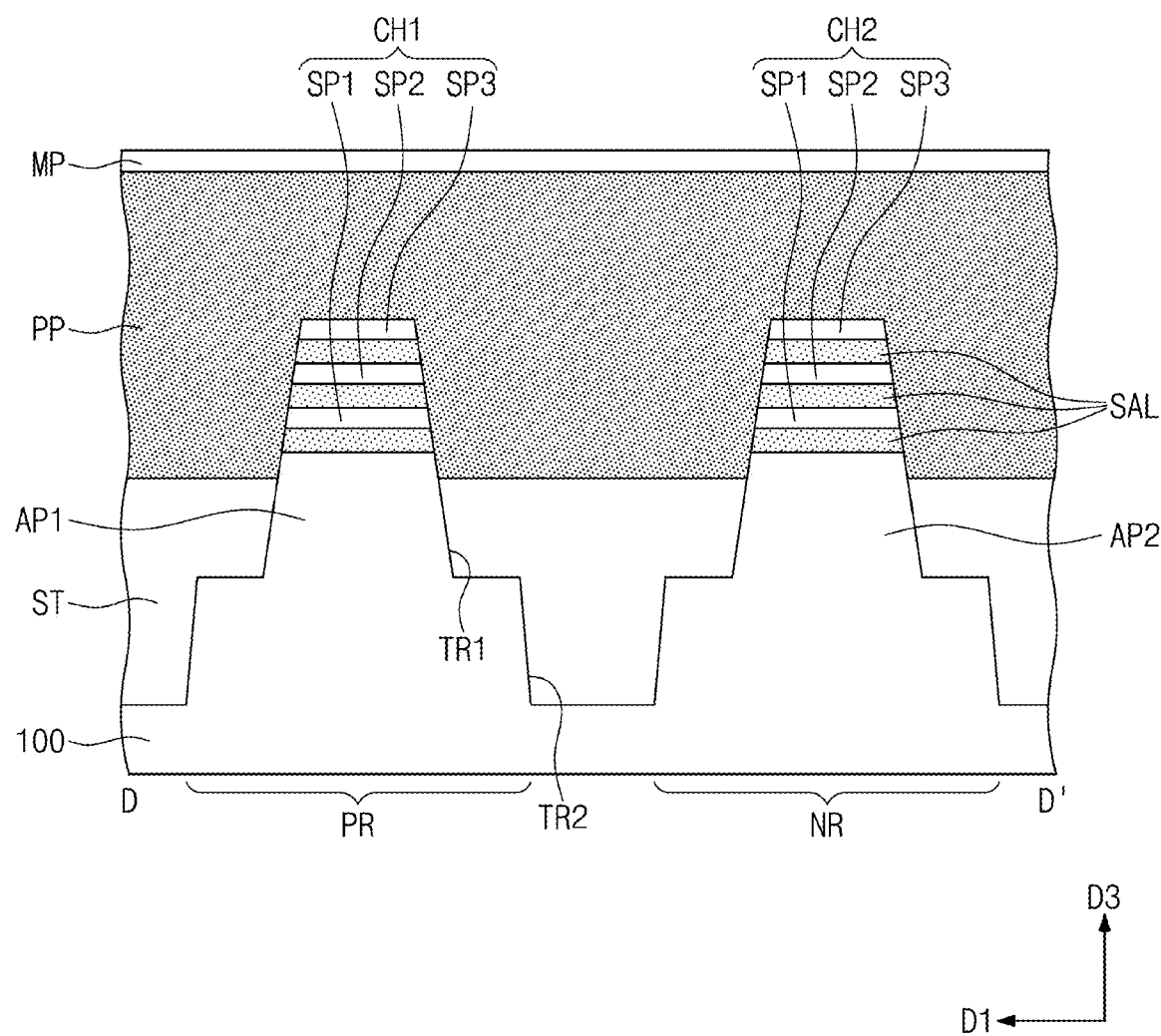
Figure 7A:
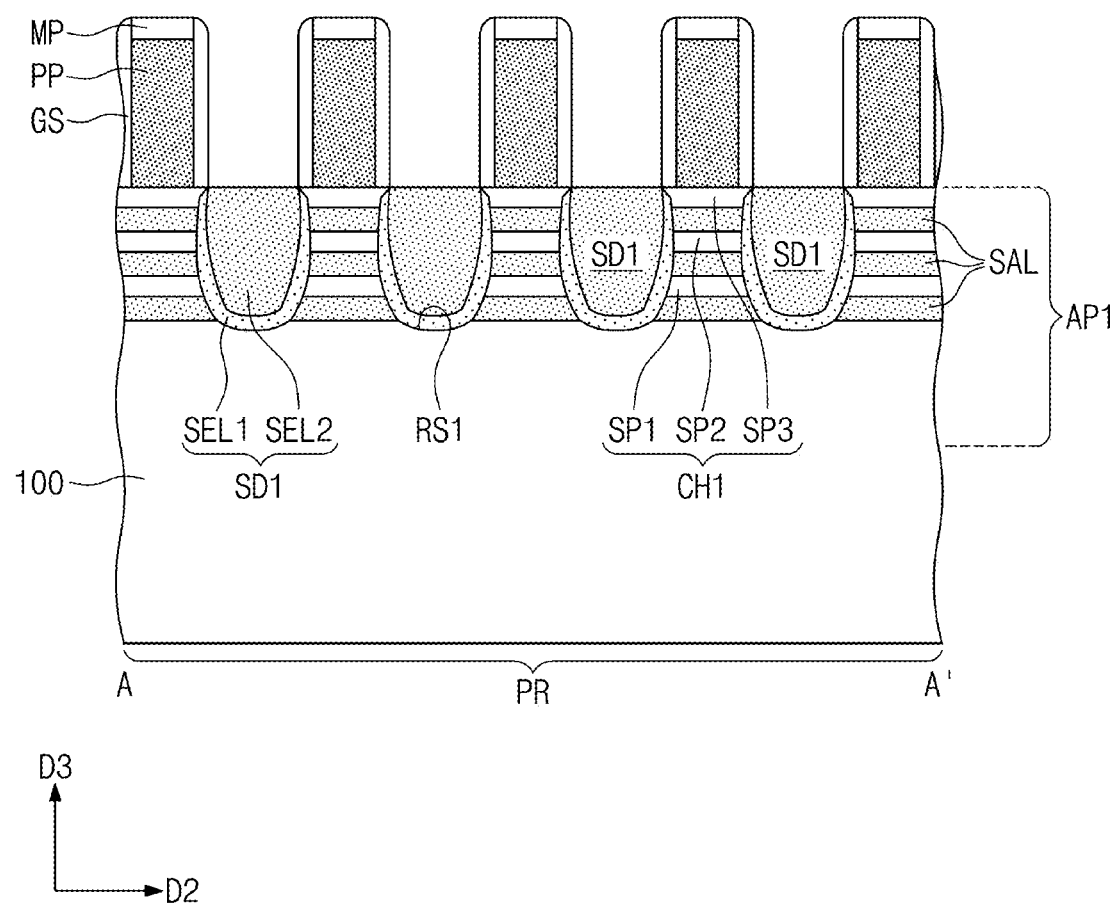
Figure 7B:
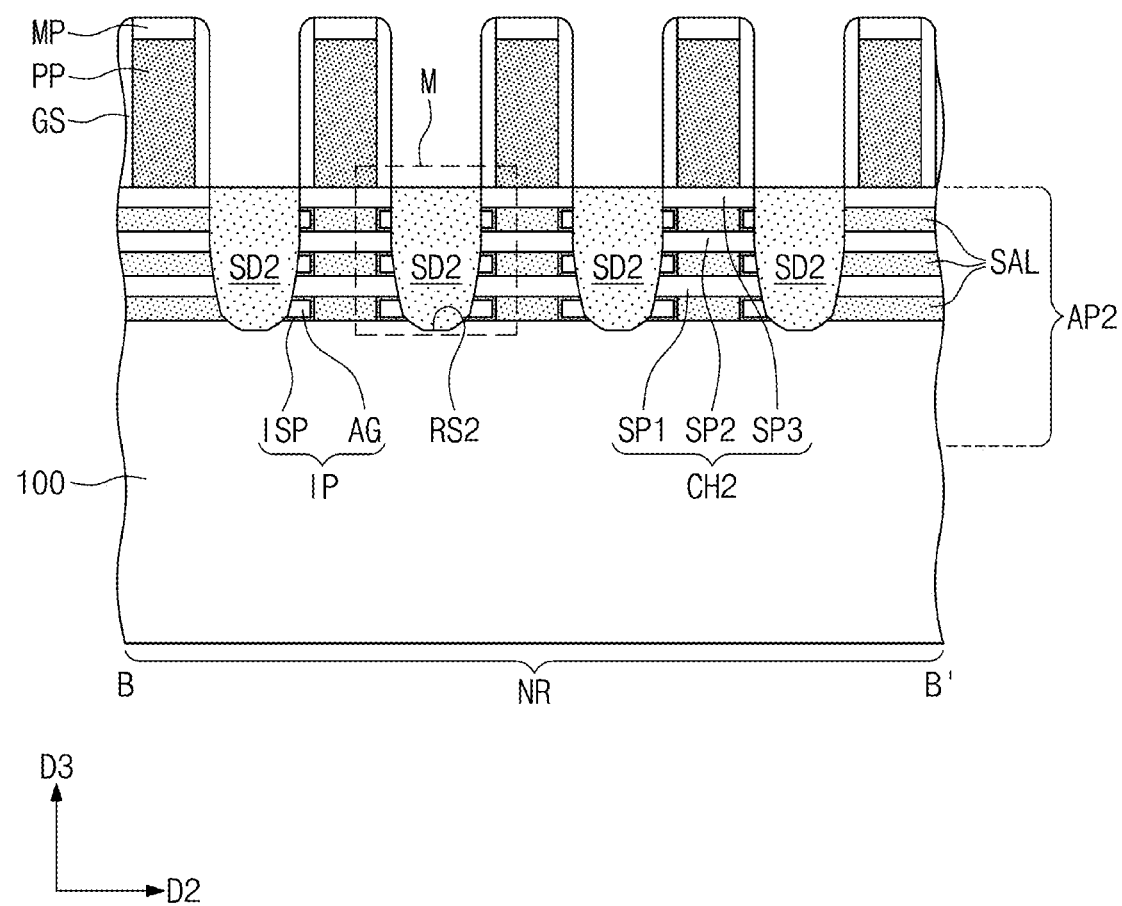
Figure 7C:
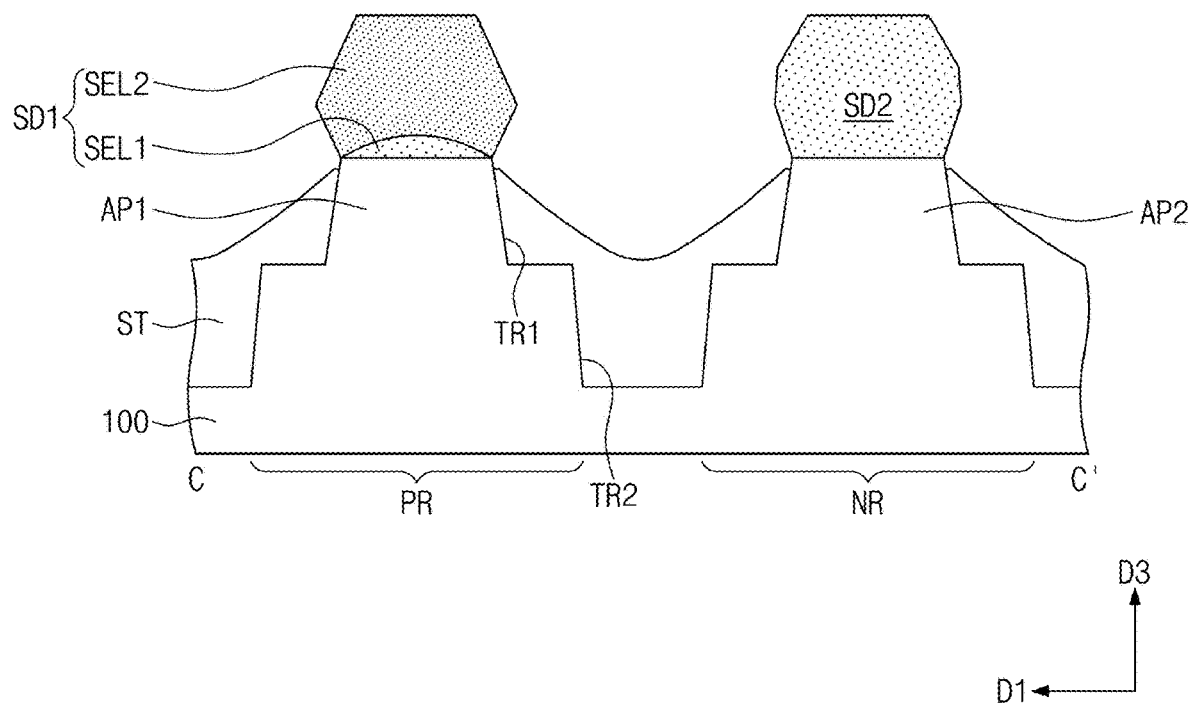
Figure 7D:
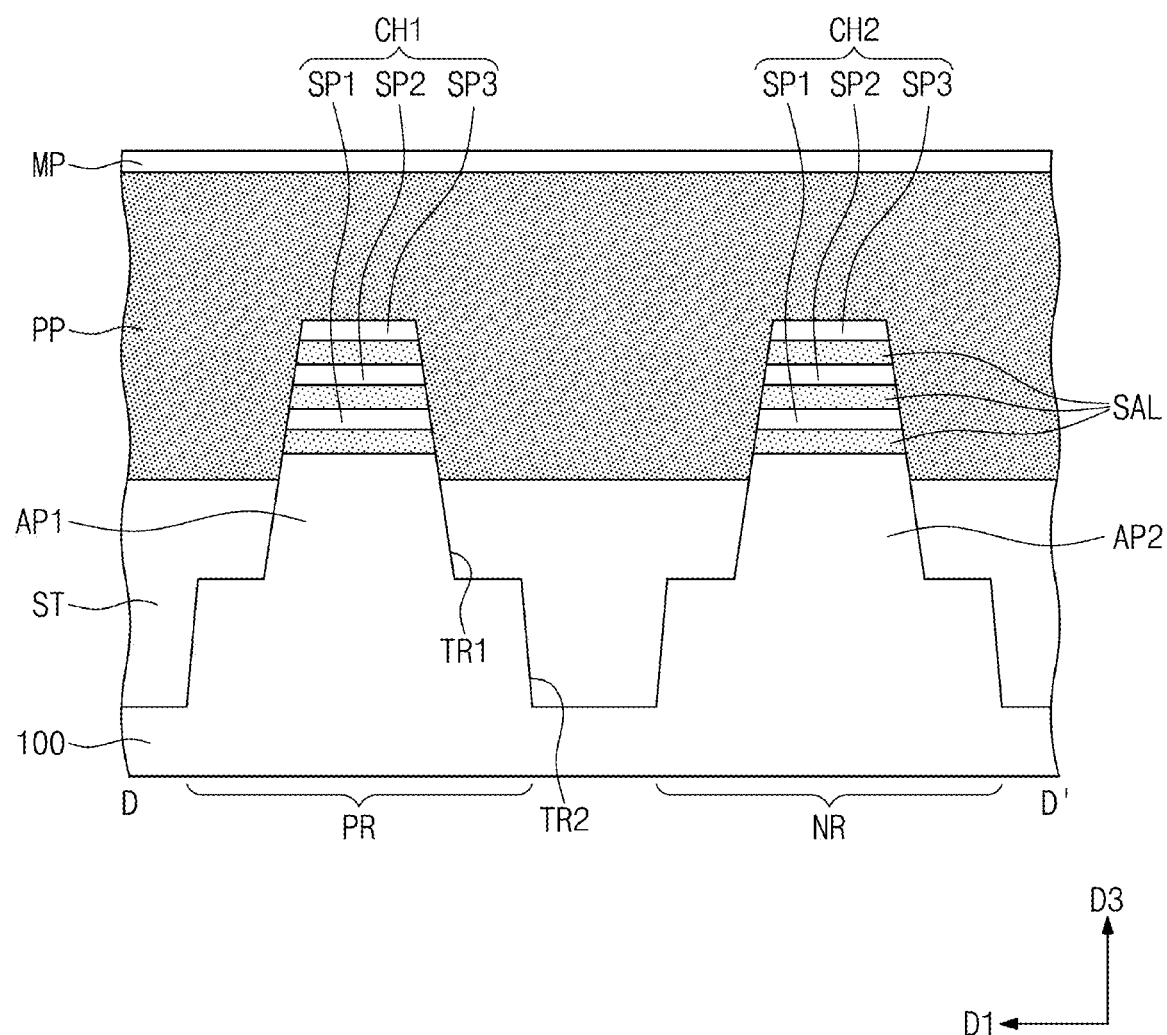
Figure 8A:
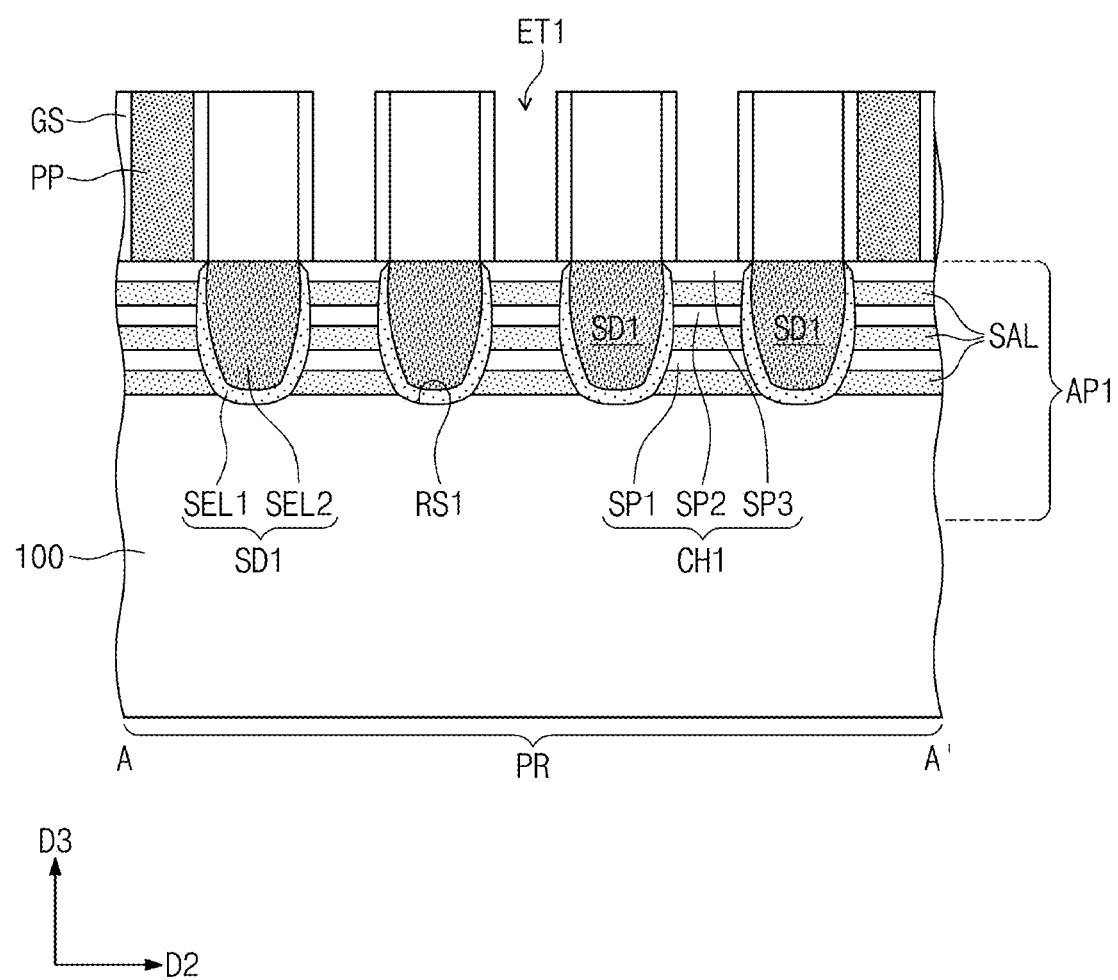
Figure 8B:
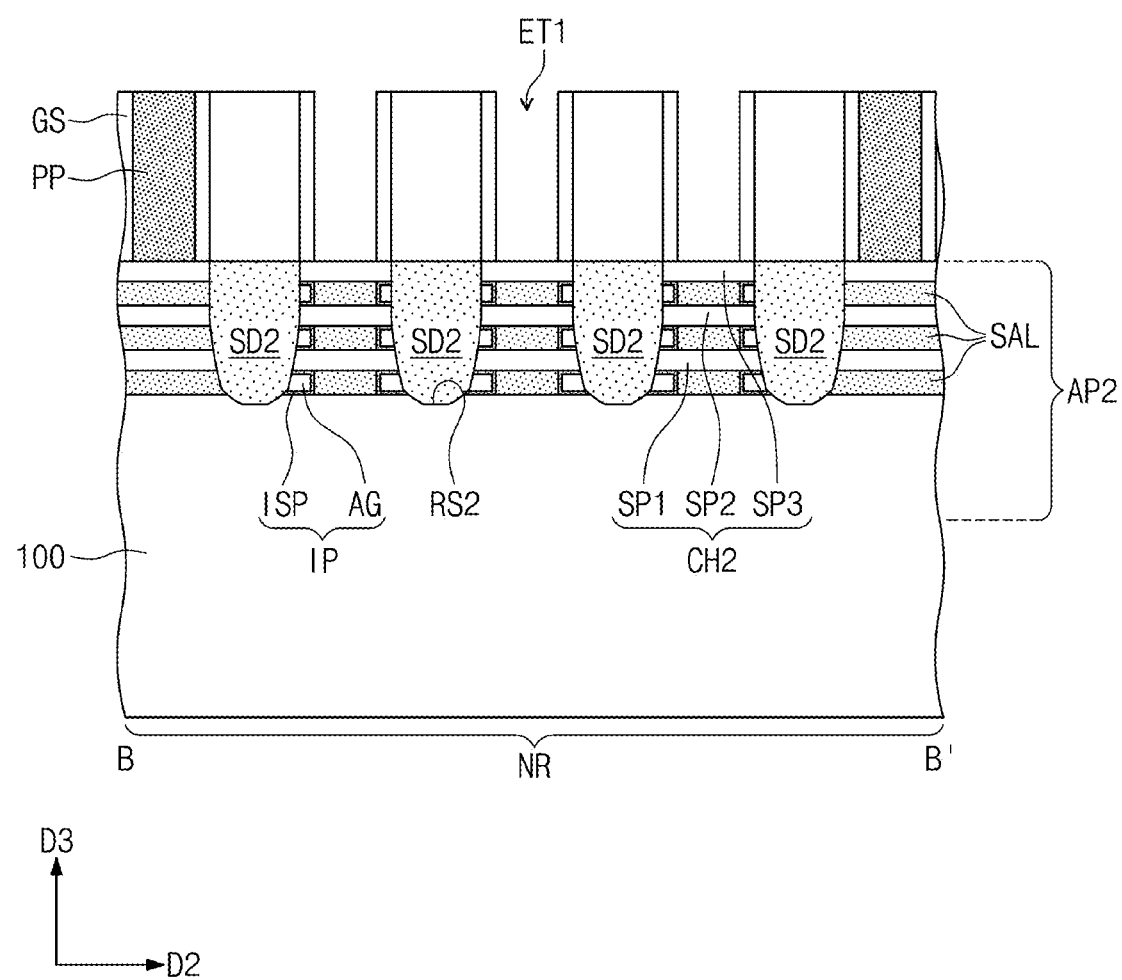
Figure 8C:
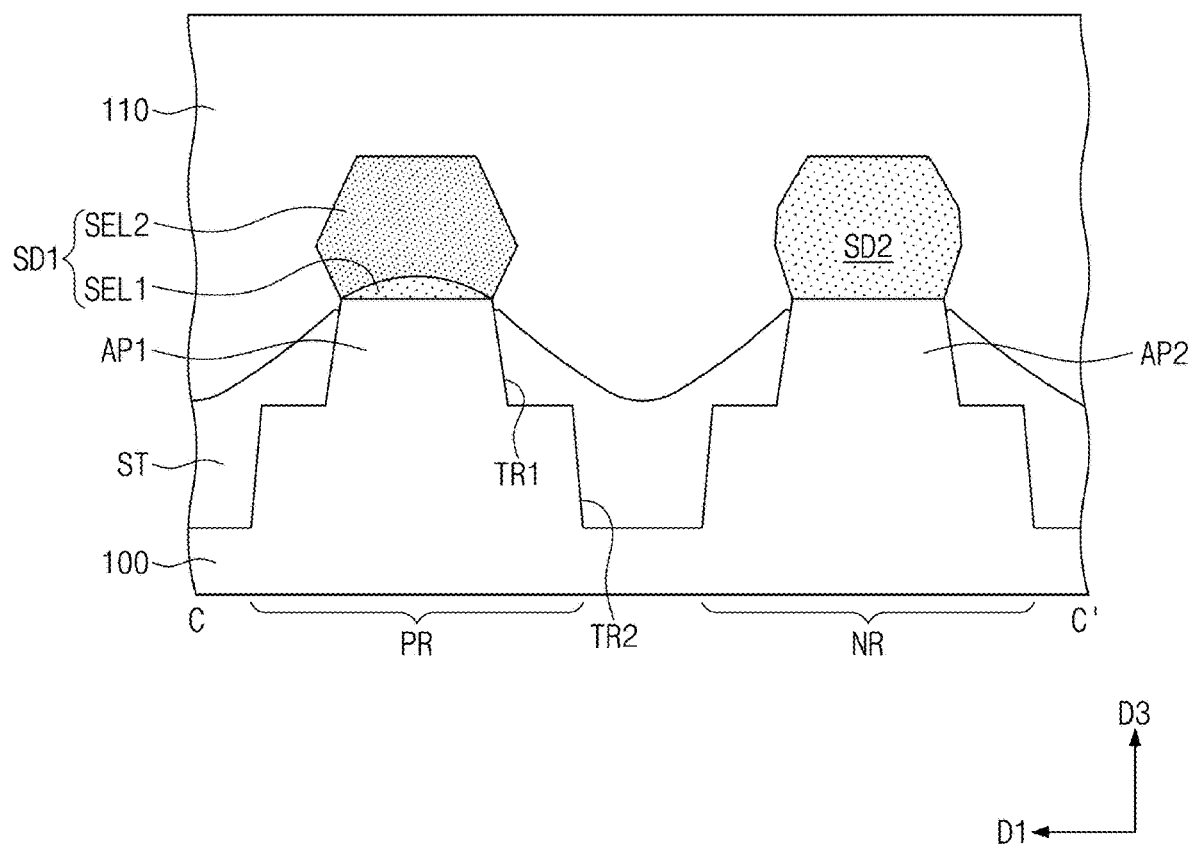
Figure 8D:
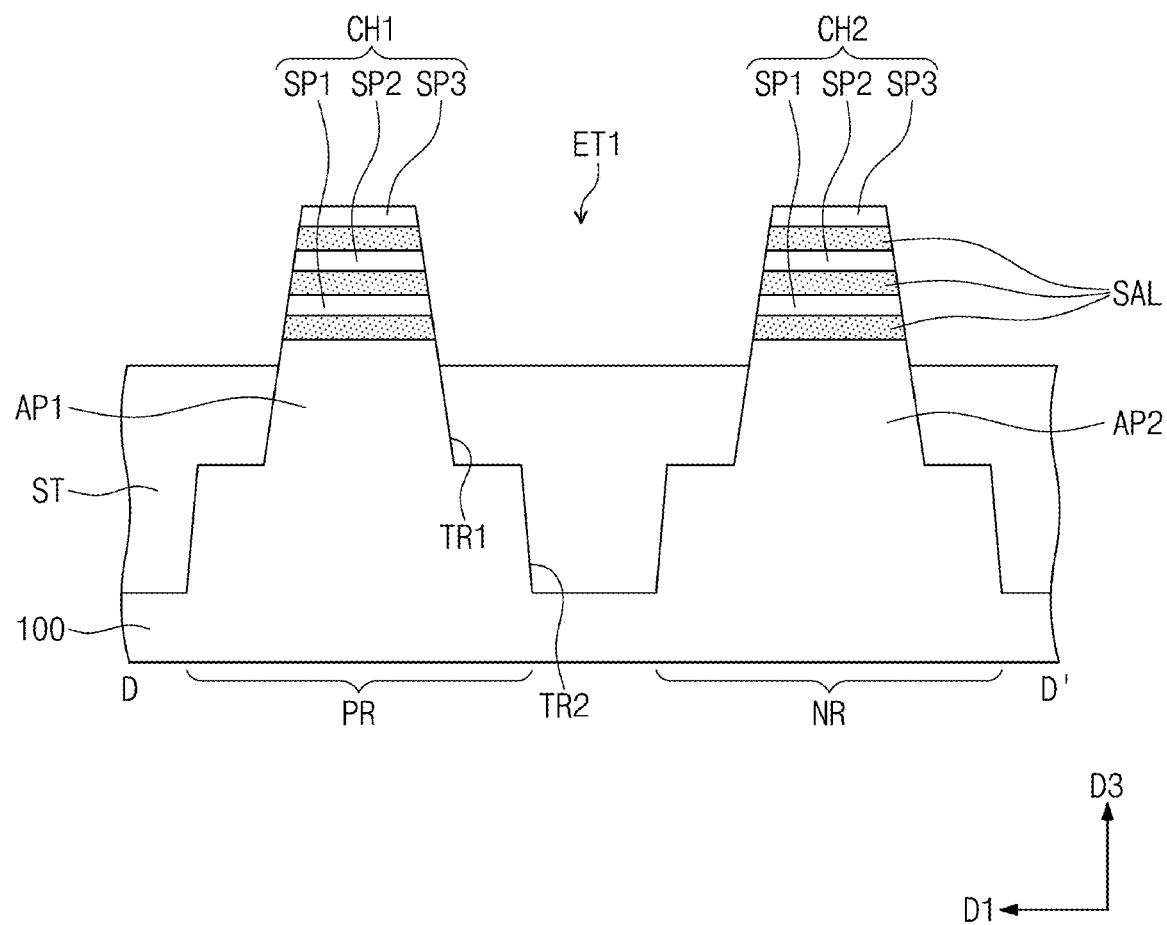
Figure 9A:
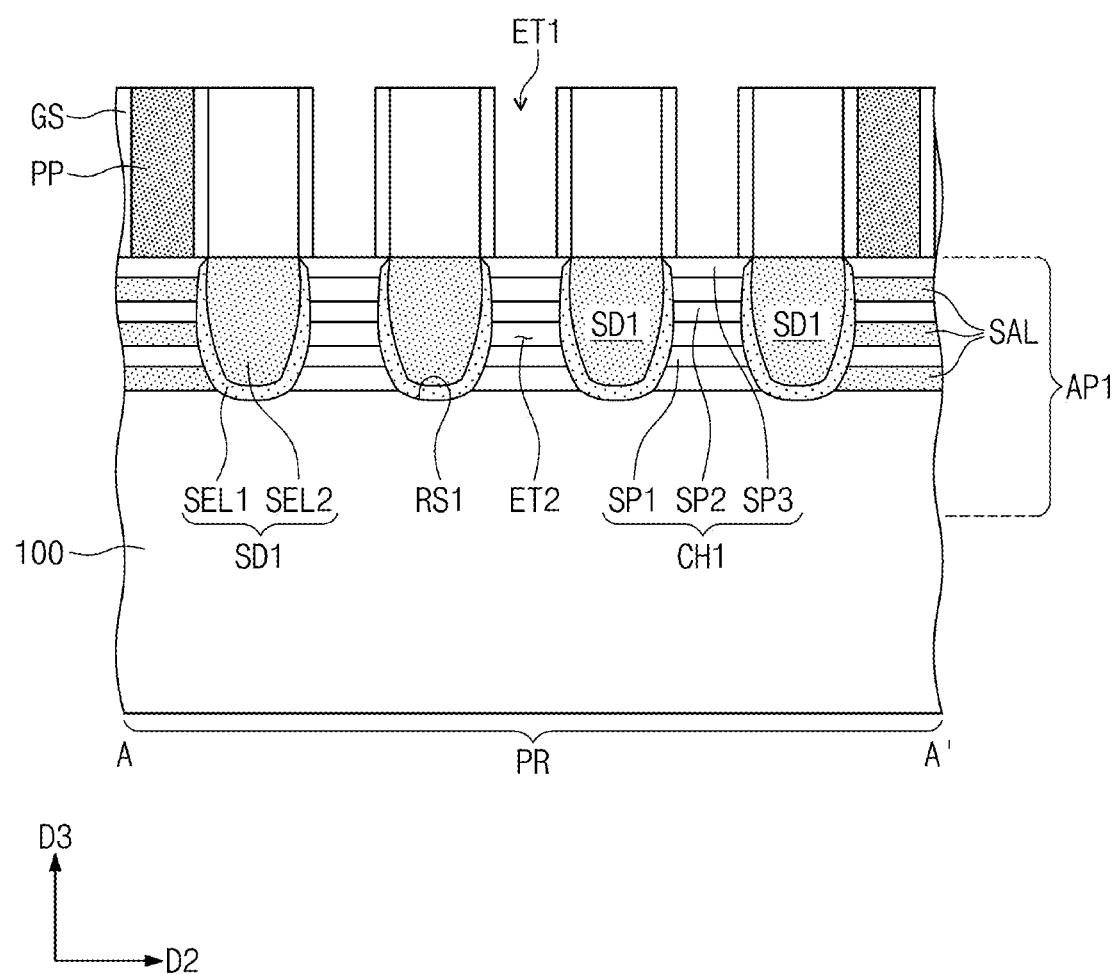
Figure 9B:
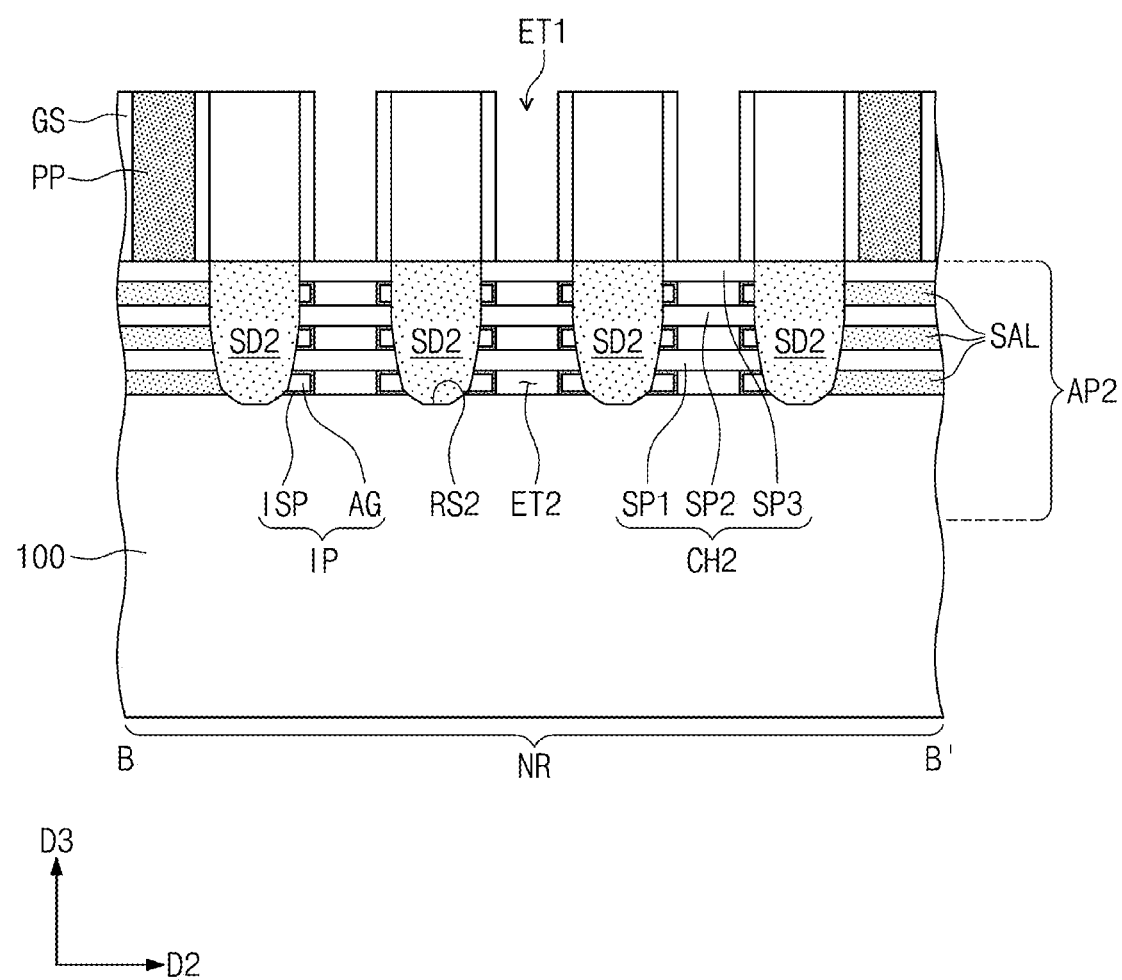
Figure 9C:
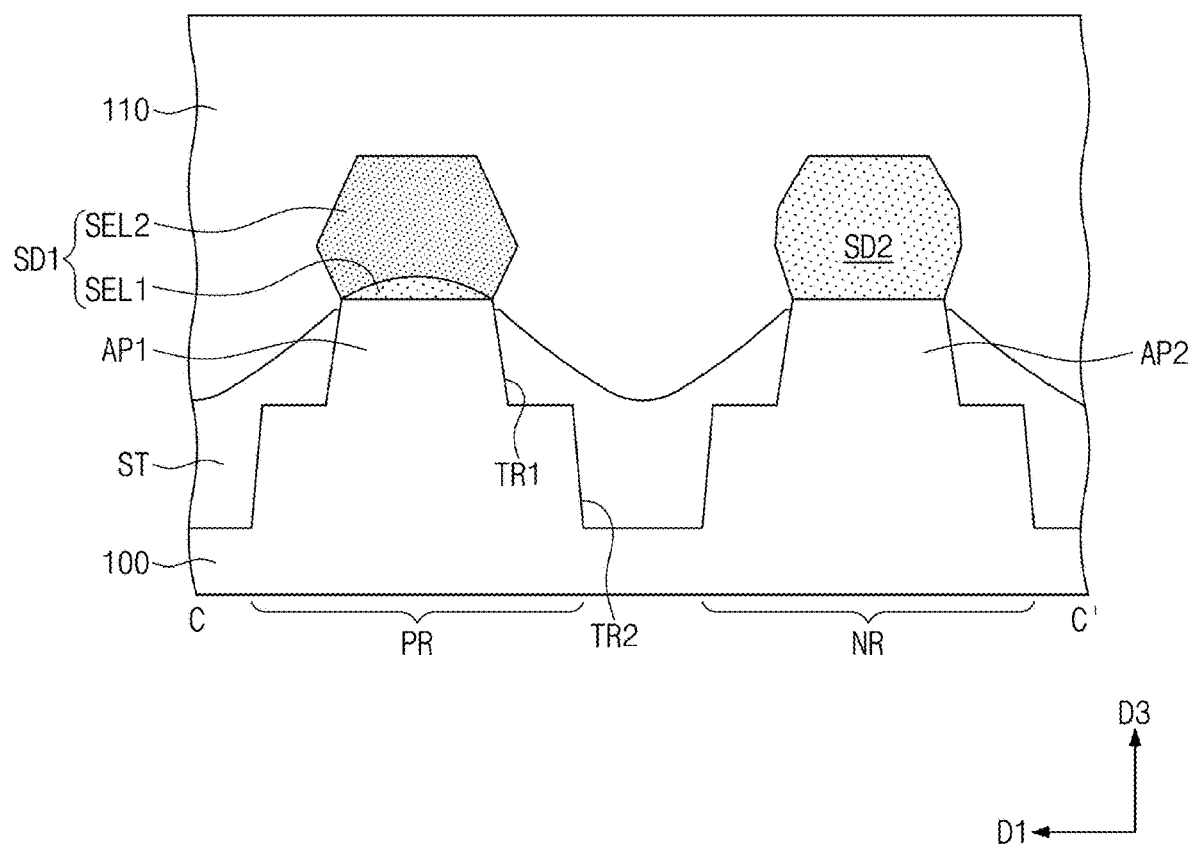
Figure 9D:
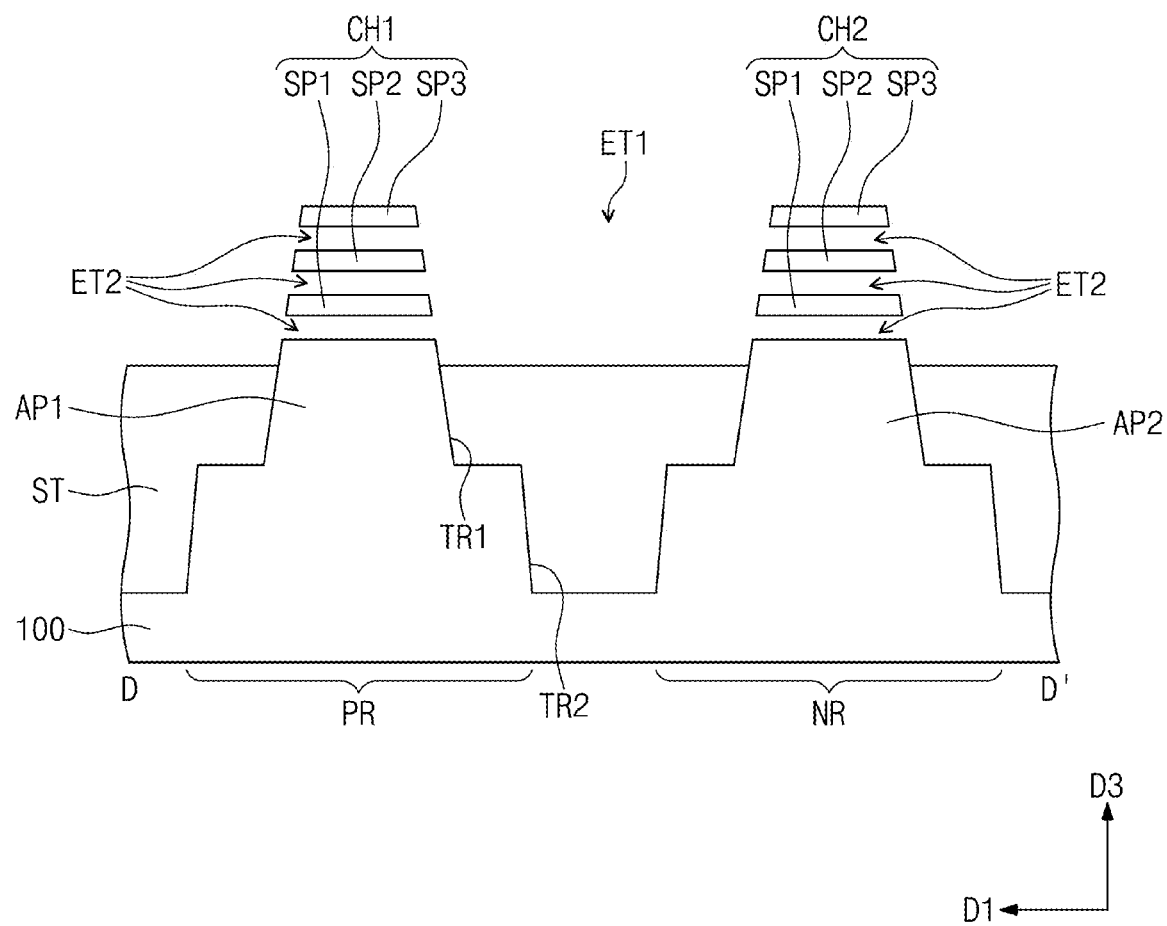
Figure 10A:
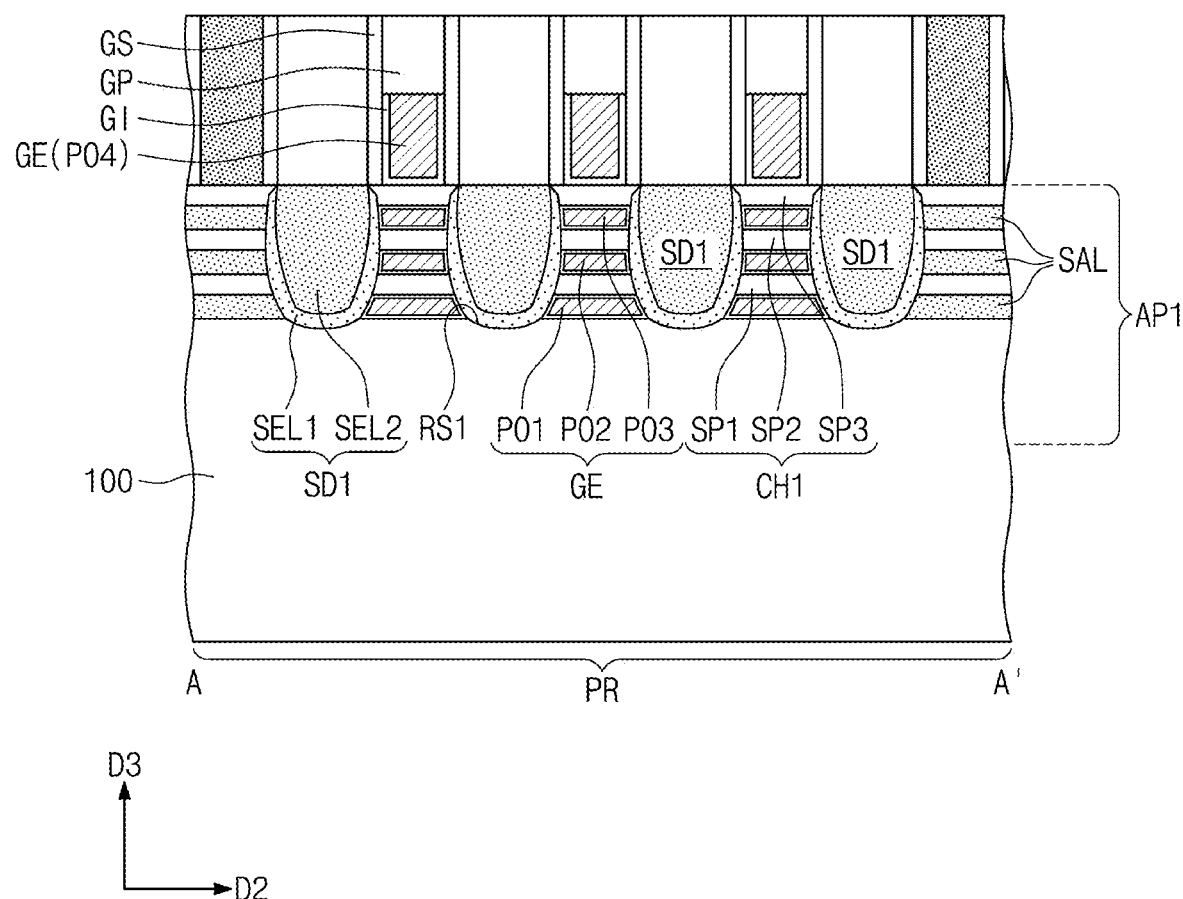
Figure 10B:
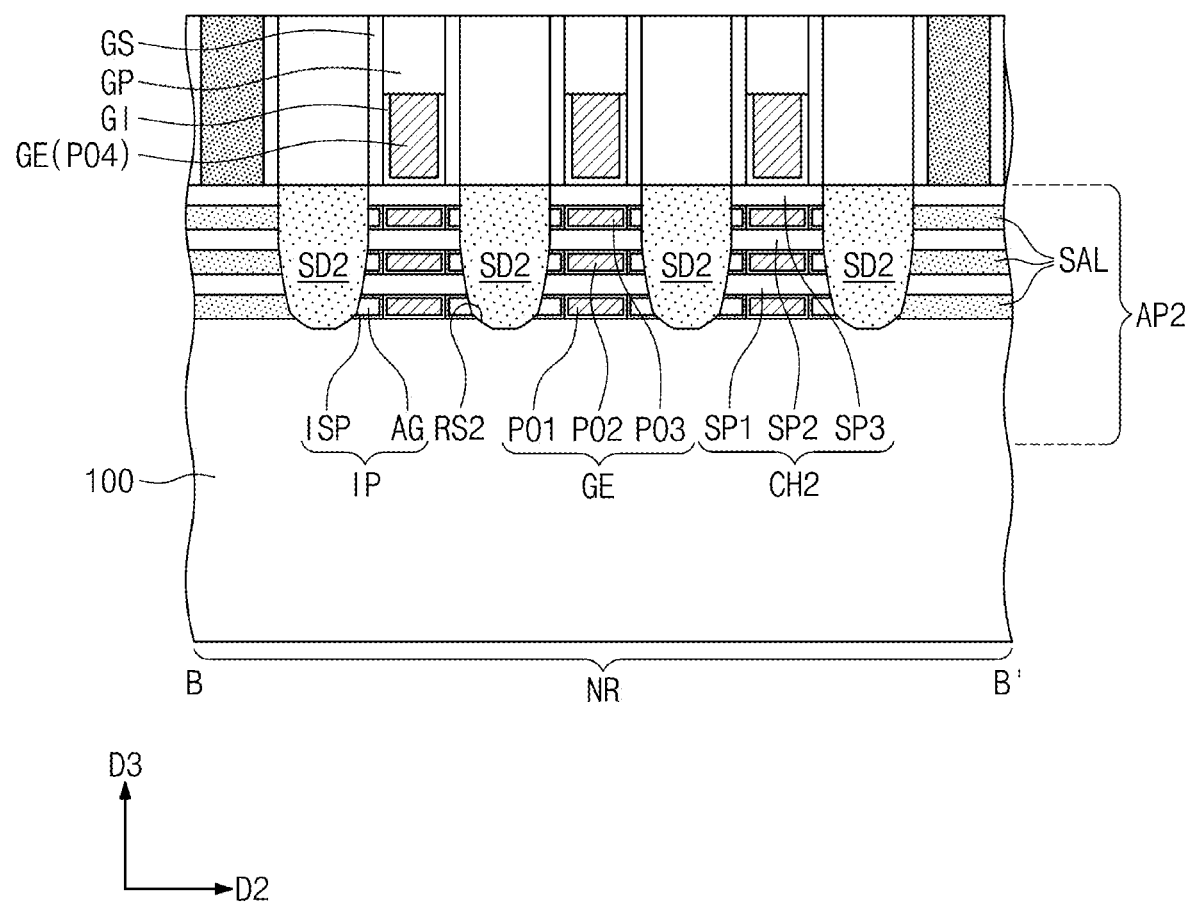
Figure 10C:
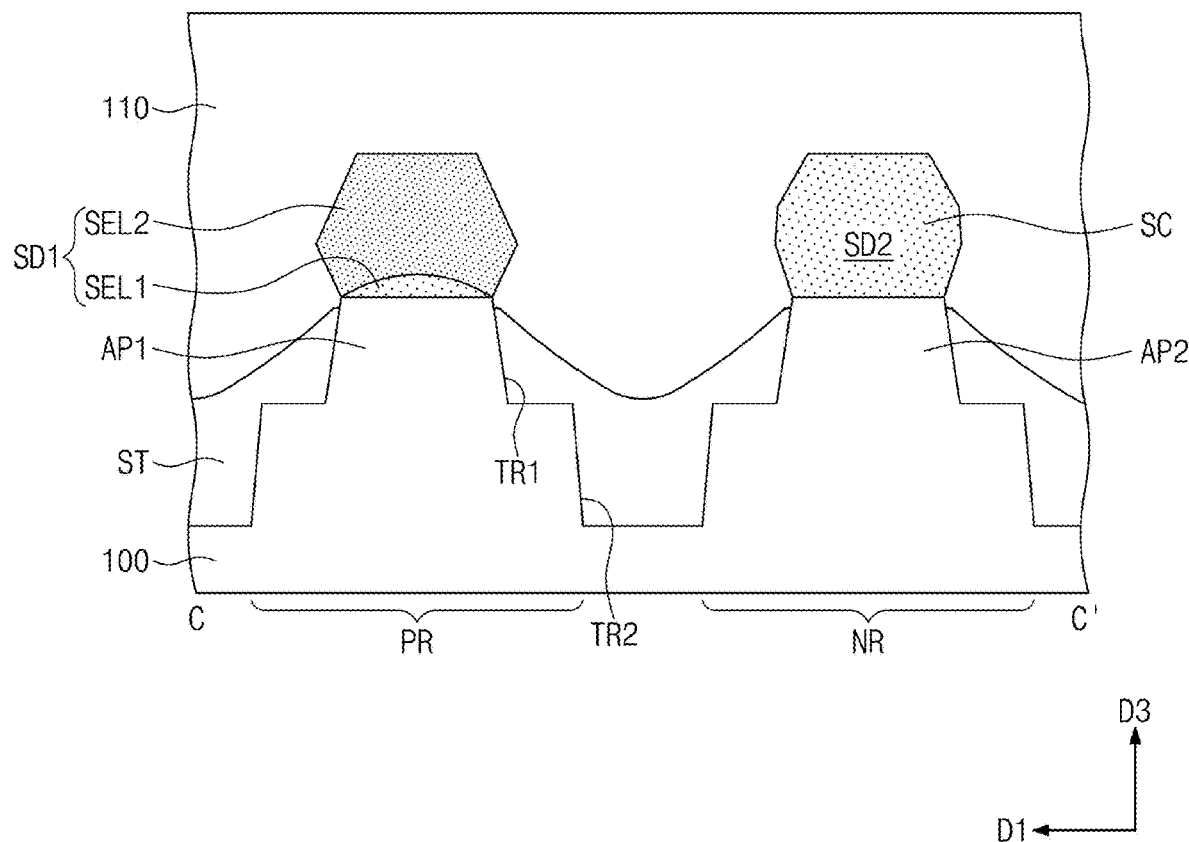
Figure 10D:
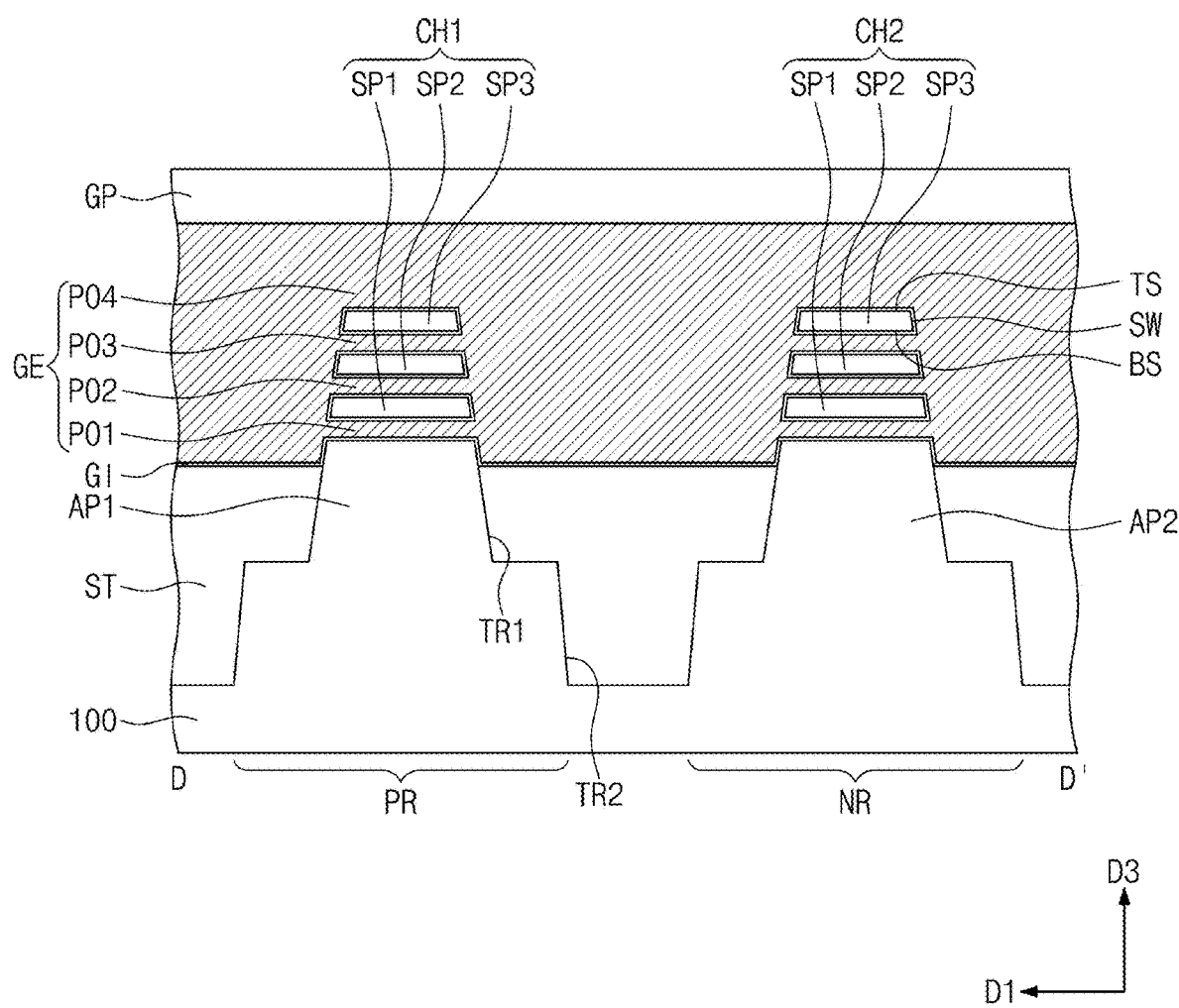

Referring to FIGS. 5A and 5B, sacrificial patterns PP may be formed on the substrate 100 to cross the first and second active patterns AP1 and AP2. Each of the sacrificial patterns PP may be formed to have a line- or bar-shape extending in the first direction D1. The sacrificial patterns PP may be arranged, with a specific pitch, in the second direction D2.

In detail, the formation of the sacrificial patterns PP may include forming a sacrificial layer on the substrate 100, forming hard mask patterns MP on the sacrificial layer, and patterning the sacrificial layer using the hard mask patterns MP as an etch mask. The sacrificial layer may be formed of or include poly silicon.

A pair of gate spacers GS may be formed on opposite side surfaces of each of the sacrificial patterns PP. The formation of the gate spacers GS may include conformally forming a gate spacer layer on the substrate 100 and anisotropically etching the gate spacer layer. The gate spacer layer may be formed of or include at least one of SiCN, SiCON, or SiN. Alternatively, the gate spacer layer may be a multi-layered structure including at least two of SiCN, SiCON, or SiN.

Referring to FIGS. 6A to 6D, first recesses RS1 may be formed in upper portions of the first active pattern AP1. The second recesses RS2 may be formed in upper portions of the second active pattern AP2. During the formation of the first and second recesses RS1 and RS2, the device isolation layer ST may be recessed at both sides of each of the first and second active patterns AP1 and AP2 (e.g., see FIG. 6C).

In detail, the first recesses RS1 may be formed by etching upper portions of the first active pattern AP1 using hard mask patterns MA and the gate spacers GS as an etch mask. Each of the first recesses RS1 may be formed between each pair of the sacrificial patterns PP. The second recesses RS2 in the upper portion of the second active pattern AP2 may be formed by the same method as that for the first recesses RS1.

Referring to FIGS. 7A to 7D, first source/drain patterns SD1 may be formed in the first recesses RS1, respectively. Specifically, a first SEG process, in which an inner surface of the first recess RS1 is used as a seed layer, may be performed to form a first semiconductor layer SEL1 The first semiconductor layer SEL1 may be grown as first to third semiconductor patterns SP1, SP2, and SP3 and the substrate 100, which are exposed through the first recess RS1, as a seed. As an example, the first SEG process may include a chemical vapor deposition (CVD) process or a molecular beam epitaxy (MBE) process.

The first semiconductor layer SEL1 may be formed of or include a semiconductor material (e.g., SiGe) having a lattice constant greater than that of the substrate 100. The first semiconductor layer SEL1 may be formed to have a relatively low germanium concentration. In other example embodiments, the first semiconductor layer SEL1 may be provided to contain only silicon (Si) and not germanium (Ge). The germanium concentration of the first semiconductor layer SEL1 may range from 0 at % to 10 at %.

A second semiconductor layer SEL2 may be formed by performing a second SEG process on the first semiconductor layer SEL1. The second semiconductor layer SEL2 may be formed to completely fill the first recess RS1. The second semiconductor layer SEL2 may be provided to have a relatively high germanium concentration. As an example, the germanium concentration of the second semiconductor layer SEL2 may range from 30 at % to 70 at %.

The first and second semiconductor layers SEL1 and SEL2 may constitute the first source/drain pattern SD1. The first and second semiconductor layers SEL1 and SEL2 may be doped with impurities in situ during the first and second SEG processes. Alternatively, the first source/drain pattern SD1 may be doped with impurities, after the formation of the first source/drain pattern SD1. The first source/drain pattern SD1 may be doped to have a first conductivity type (e.g., p-type).

Second source/drain patterns SD2 may be formed in the second recesses RS2, respectively. Specifically, the second source/drain pattern SD2 may be formed by a SEG process using an inner surface of the second recess RS2 as a seed layer. In example embodiments, the second source/drain pattern SD2 may be formed of or include the same semiconductor material (e.g., Si) as the substrate 100. The second source/drain pattern SD2 may be doped to have a second conductivity type (e.g., n-type). The inner spacers IP may be respectively formed between the second source/drain pattern SD2 and the sacrificial layers SAL. The formation of the inner spacers IP and the second source/drain pattern SD2 will be described in more detail with reference to FIGS. 11 to 19.

Referring to FIGS. 8A to 8D, a first interlayer insulating layer 110 may be formed to cover the first and second source/drain patterns SD1 and SD2, the hard mask patterns MP, and the gate spacers GS. As an example, the first interlayer insulating layer 110 may include a silicon oxide layer.

The first interlayer insulating layer 110 may be planarized to expose top surfaces of the sacrificial patterns PP. The planarization of the first interlayer insulating layer 110 may be performed using an etch-back or chemical-mechanical polishing (CMP) process. All of the hard mask patterns MP may be removed during the planarization process. As a result, a top surface of the first interlayer insulating layer 110 may be coplanar with the top surfaces of the sacrificial patterns SAP and the top surfaces of the gate spacers GS.

In example embodiments, the exposed sacrificial patterns PP may be selectively removed. As a result of the removal of the sacrificial pattern PP, first empty spaces ET1 may be formed to expose the first and second active patterns AP1 and AP2 (e.g., see FIG. 8D).

In example embodiments, some of the sacrificial patterns PP may not be removed. For example, the sacrificial pattern PP on the cell boundary may not be removed. Specifically, a mask layer may be formed on some of the sacrificial patterns PP, which should not be removed, to reduce or prevent them from being removed by the selective removal process of the sacrificial patterns PP. As a result of the removal of the sacrificial pattern PP, the first and second active patterns AP1 and AP2 may be exposed through the first empty space ET1. The sacrificial layers SAL of each of the first and second active patterns AP1 and AP2 may be exposed through the first empty space ET1.

Referring to FIGS. 9A to 9D, the sacrificial layers SAL, which are exposed through the first empty space ET1, may be selectively removed. In detail, an etching process may be performed in such a way that only the sacrificial layers SAL are selectively removed without etching of the first to third semiconductor patterns SP1, SP2, and SP3.

The etching process may be chosen to exhibit a high etch rate for a material (e.g., SiGe) having a relatively high germanium concentration. For example, the etching process may have a high etch rate for silicon-germanium whose germanium concentration is higher than 10 at %.

During the etching process, the sacrificial layers SAL may be removed from the PMOSFET region PR and the NMOSFET region NR. The etching process may be a wet etching process. An etching material, which is used in the etching process, may be chosen to quicklsy remove the sacrificial layer SAL having a relatively high germanium concentration. Meanwhile, during the etching process, the first source/drain pattern SD1 in the PMOSFET region PR may be protected by the first semiconductor layer SEL1 having a relatively low germanium concentration.

Referring back to FIG. 9D, since the sacrificial layers SAL are selectively removed, only the first to third semiconductor patterns SP1, SP2, and SP3 may be left on each of the first and second active patterns AP1 and AP2. That is, second empty spaces ET2 may be formed as a result of the removal of the sacrificial layers SAL. The second empty spaces ET2 may be formed between the first to third semiconductor patterns SP1, SP2, and SP3.

Referring to FIGS. 10A to 10D, a gate insulating layer GI may be conformally formed in the first and second empty spaces ET1 and ET2. A gate electrode GE may be formed on the gate insulating layer GI. The gate electrode GE may be formed to fill the first and second empty spaces ET1 and ET2. Specifically, the gate electrode GE may include first to third portions PO1, PO2, and PO3 filling the second empty spaces ET2. The gate electrode GE may further include a fourth portion PO4 filling the first empty space ET1. A gate capping pattern GP may be formed on the gate electrode GE.

Referring back to FIGS. 1 and 2A to 2D, a second interlayer insulating layer 120 may be formed on the first interlayer insulating layer 110. The second interlayer insulating layer 120 may include a silicon oxide layer. Active contacts AC may be formed to penetrate the second interlayer insulating layer 120 and the first interlayer insulating layer 110 and to be electrically connected to the first and second source/drain patterns SD1 and SD2. A gate contact GC may be formed to penetrate the second interlayer insulating layer 120 and the gate capping pattern GP and to be electrically connected to the gate electrode GE.

A pair of division structures DB may be formed at both sides of a logic cell LC. The division structure DB may be formed to penetrate the second interlayer insulating layer 120, a remaining portion of the sacrificial pattern PP, and an upper portion of the active pattern AP1 or AP2 below the sacrificial pattern PP. The division structure DB may be formed of or include at least one of insulating materials (e.g., silicon oxide or silicon nitride).

A third interlayer insulating layer 130 may be formed on the active contacts AC and the gate contacts GC. A first metal layer M1 may be formed in the third interlayer insulating layer 130. A fourth interlayer insulating layer 140 may be formed on the third interlayer insulating layer 130. A second metal layer M2 may be formed in the fourth interlayer insulating layer 140.

Figure 11:
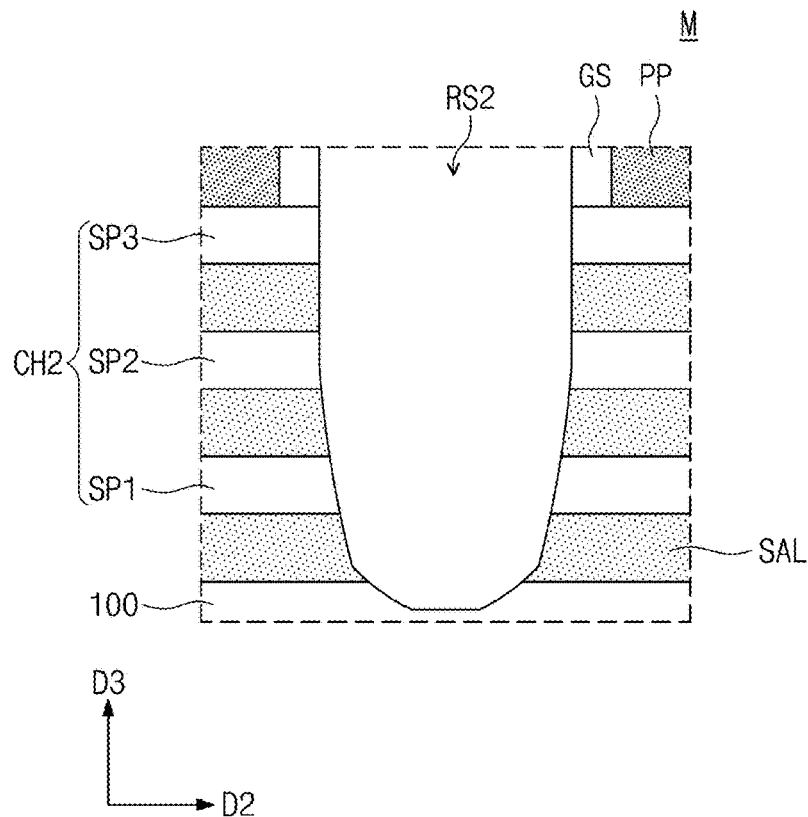
FIGS. 11 to 19 are enlarged sectional views, which are provided to illustrate a method of forming an inner spacer according to example embodiments of the inventive concepts and to illustrate a portion M of FIGS. 6B and 7B.

The formation of the inner spacers IP and the second source/drain pattern SD2 will be described in more detail with reference to FIGS. 11 to 19. Referring to FIG. 11, the second recess RS2 may be formed between a pair of the sacrificial patterns PP. The second recess RS2 in the second direction D2 may have a width increasing in the third direction D3. The first to third semiconductor patterns SP1, SP2, and SP3 and the substrate 100 may be exposed through the second recess RS2. The sacrificial layers SAL may be exposed through the second recess RS2.

Figure 12:
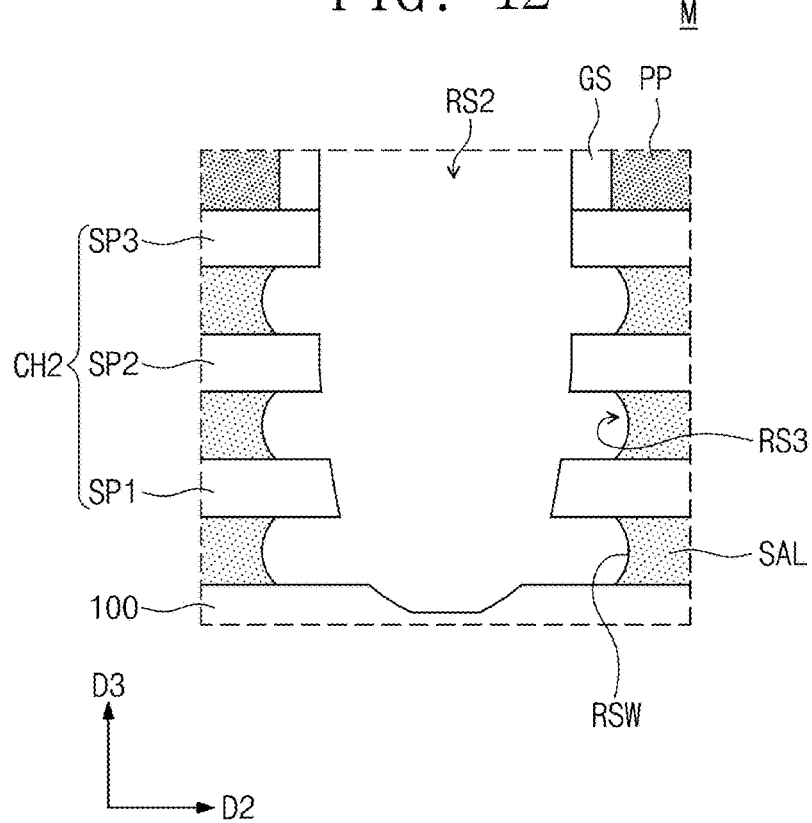

Referring to FIG. 12, the exposed sacrificial layers SAL may be selectively etched by an isotropic etching process. Specifically, the exposed sacrificial layers SAL may be recessed by a wet etching process through the second recess RS2. As a result of the recess of the sacrificial layers SAL, third recesses RS3 may be formed. Each of the third recesses RS3 may be a region that is horizontally recessed in a direction away from the second recess RS2. As an example, since the third recess RS3 is formed, at least one of the sacrificial layers SAL may be formed to have the recessed side surface RSW.

Figure 13:
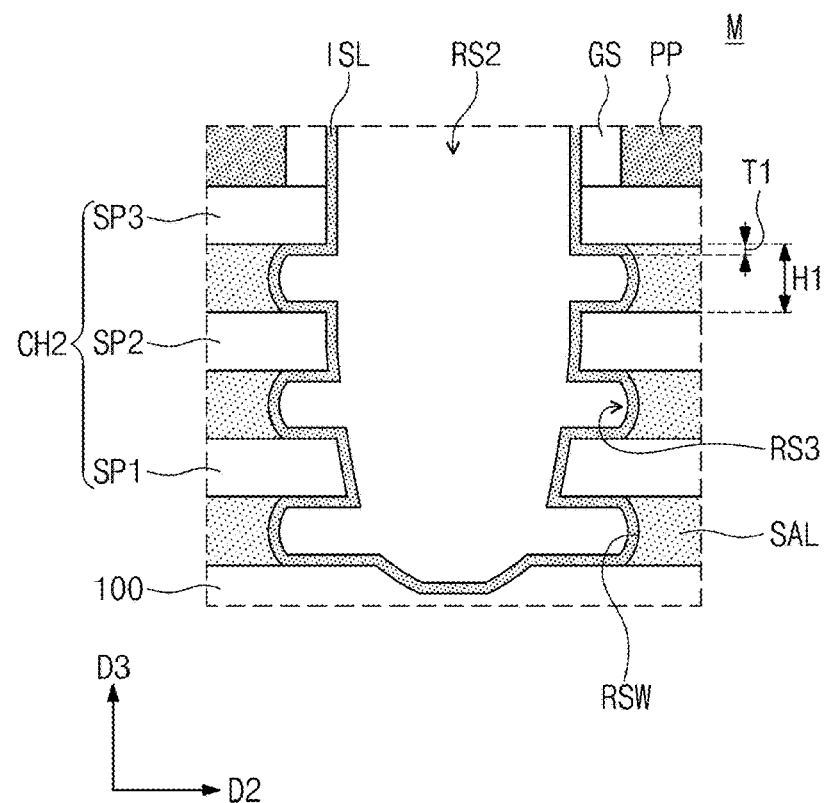

Referring to FIG. 13, an inner insulating layer ISL may be conformally formed in the second and third recesses RS2 and RS3. The inner insulating layer ISL may be formed to just partially fill the third recess RS3. In other words, the inner insulating layer ISL may have a thickness Ti that is less than half of a height H1 of the third recess RS3 in the third direction D3 (e.g., T1<H1/2). For example, the inner insulating layer ISL may be formed of or include at least one of silicon oxide or low-k dielectric materials whose dielectric constants are lower than that of silicon oxide.

Figure 14:
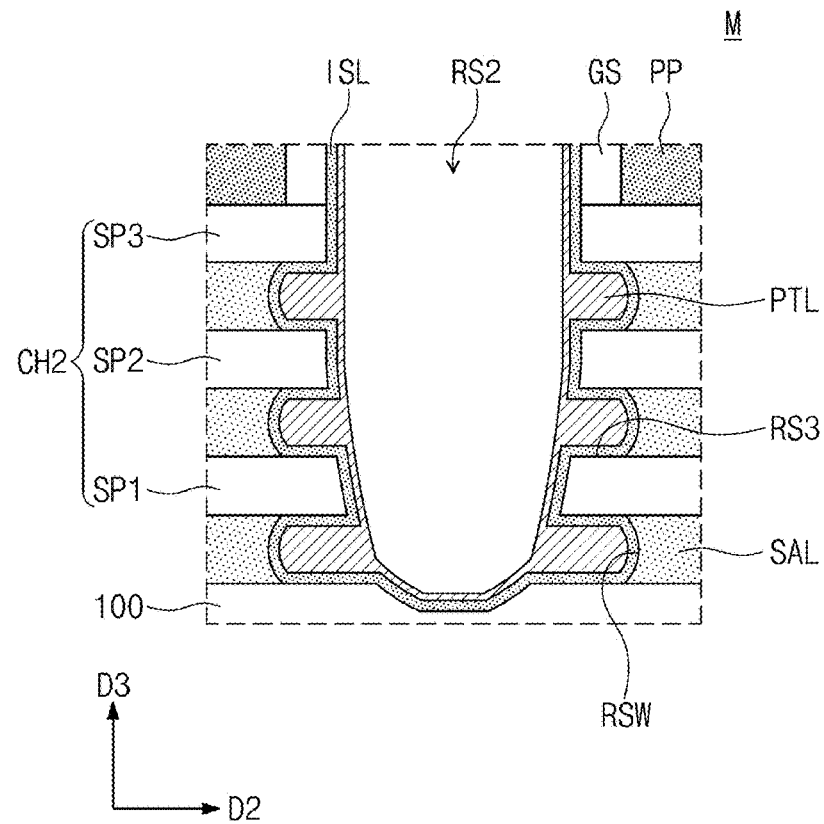

Referring to FIG. 14, a protection layer PTL may be formed to fully fill the third recesses RS3 covered with the inner insulating layer ISL. The protection layer PTL may be formed of or include at least one of materials having an etch selectivity with respect to the inner insulating layer ISL. For example, the protection layer PTL may be formed of or include at least one of aluminum oxide or silicon oxide.

Figure 15:
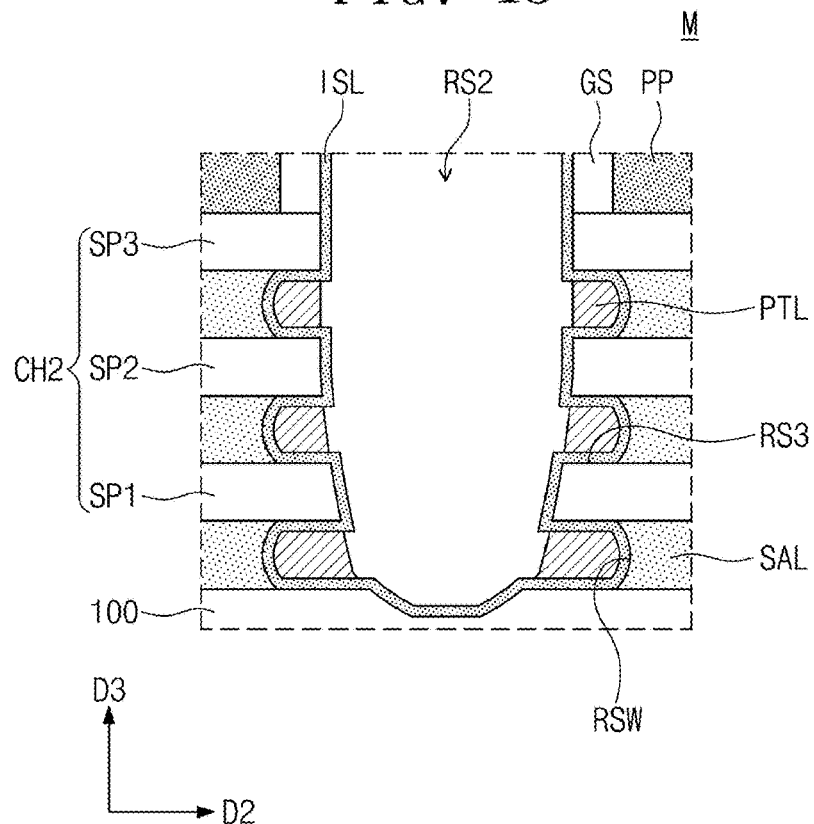

Referring to FIG. 15, an isotropic etching process may be performed to selectively etch the protection layer PTL. The etching process may be performed to expose the inner insulating layer ISL on the first to third semiconductor patterns SP1, SP2, and SP3. For example, the protection layer PTL may be etched to expose portions of the inner insulating layer ISL covering side surfaces of the first to third semiconductor patterns SP1, SP2, and SP3.

Figure 16:
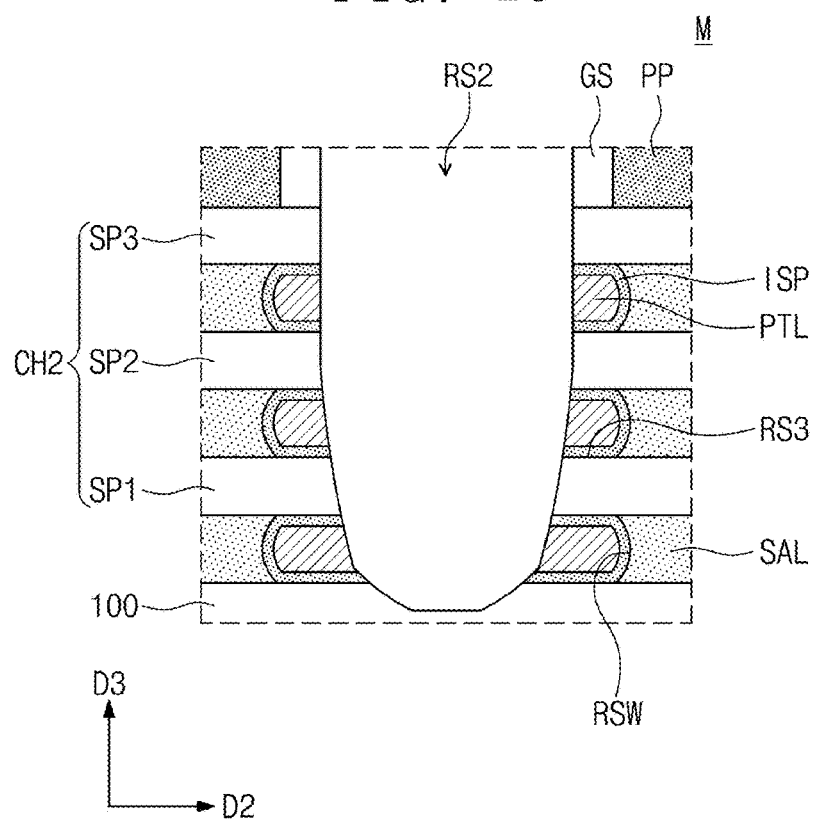

Referring to FIG. 16, the portions of the inner insulating layer ISL, which are exposed by the etching of the protection layer PTL, may be etched. For example, the exposed portions of the inner insulating layer ISL may be removed by the etching step, and thus, inner insulating patterns ISP may be localized in the third recesses RS3, respectively. As the removal of the exposed portions of the inner insulating layer ISL, the first to third semiconductor patterns SP1, SP2, and SP3 and the substrate 100 may again be exposed again through the second recess RS2.

Figure 17:
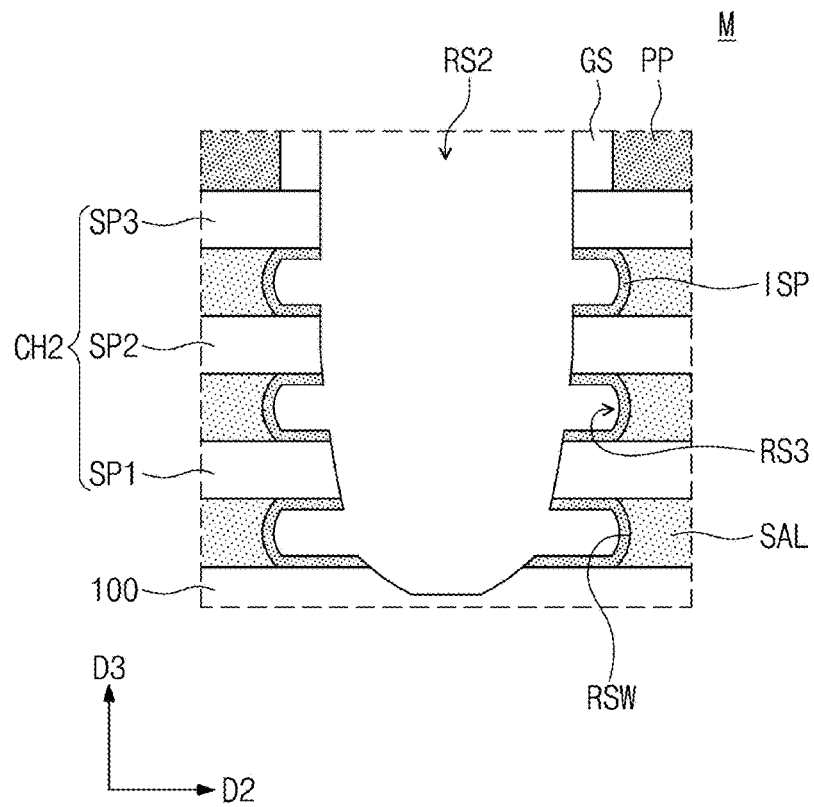

Referring to FIG. 17, the remaining portion of the protection layer PTL may be completely removed. The removal of the protection layer PTL may be performed in the same or substantially the same manner as that in the aforedescribed process of selectively etching the protection layer PTL. Since the protection layer PTL is completely removed, only the inner insulating pattern ISP may be left in the third recess RS3. The remaining space of the third recess RS3 other than the inner insulating pattern ISP may be an empty space.

Figure 18:
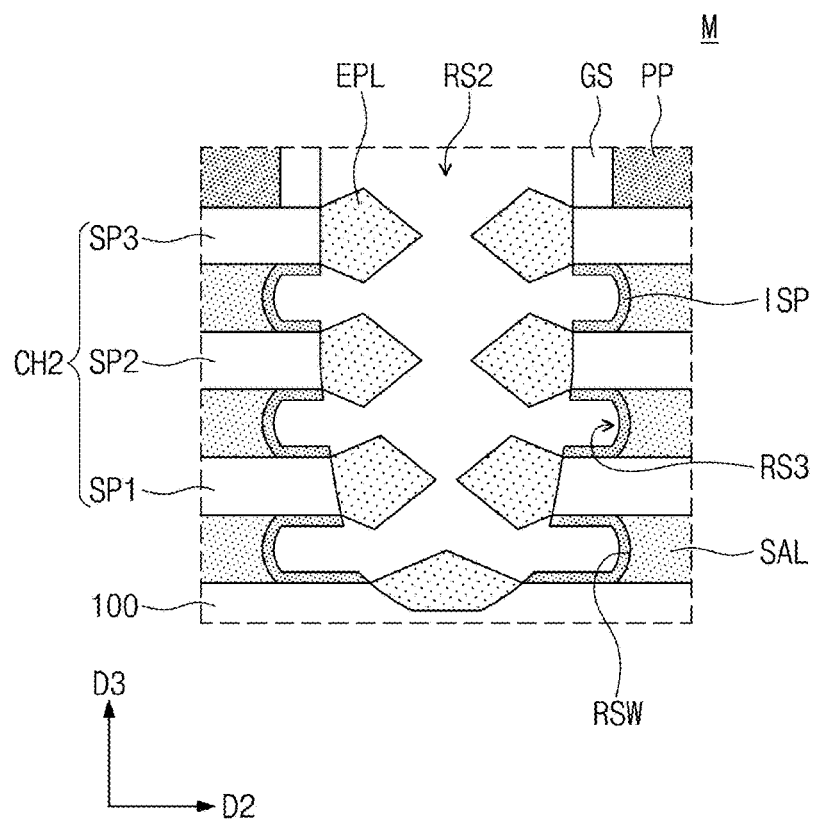

Referring to FIG. 18, an epitaxial layer EPL may be formed by a SEG process, in which the first to third semiconductor patterns SP1, SP2, and SP3 and the substrate 100 exposed through the second recess RS2 are used as a seed layer. The epitaxial layer EPL may not be grown on the inner insulating pattern ISP.

The epitaxial layer EPL may be grown with a specific directionality. The epitaxial layer EPL may be mainly grown in a direction toward the center of the second recess RS2. In other words, a growth speed of the epitaxial layer EPL may be fastest in a direction toward the center of the second recess RS2. Due to the inner insulating pattern ISP, the epitaxial layer EPL may be reduced or prevented to be grown in the third recess RS3. Thus, the epitaxial layer EPL may be grown to mainly fill the second recess RS2, but not the third recess RS3.

Figure 19:
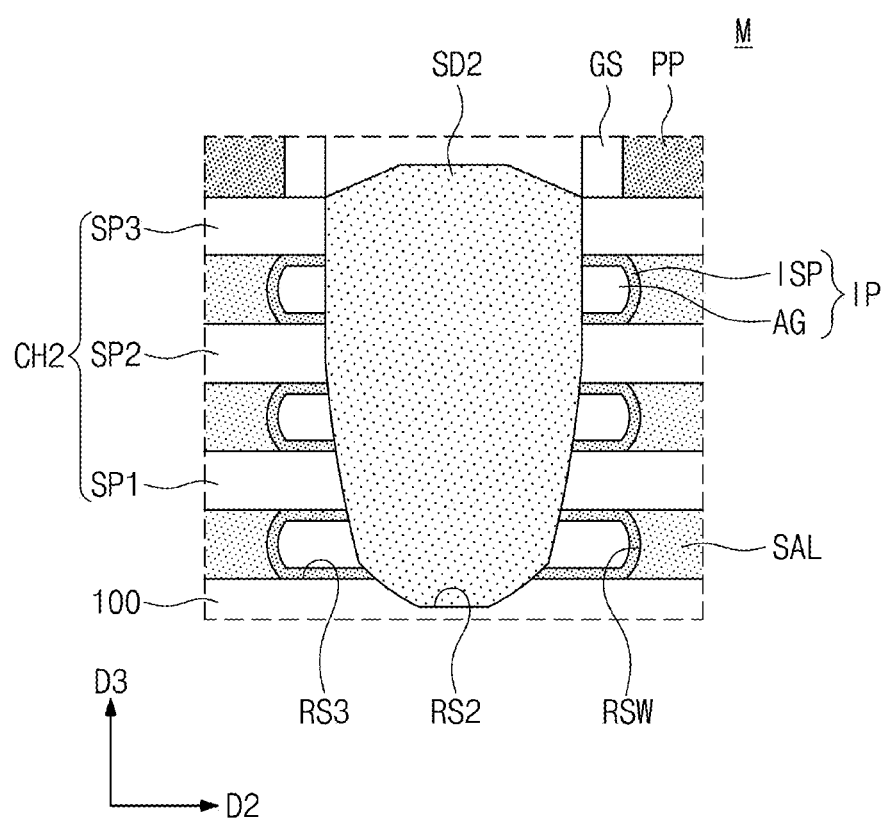

Referring to FIG. 19, since the epitaxial layer EPL is formed to fill the second recess RS2, the second source/drain pattern SD2 may be formed in the second recess RS2. Specifically, the epitaxial layers EPL, which are respectively grown from the first to third semiconductor patterns SP1, SP2, and SP3 and the substrate 100, may be merged to form each of the second source/drain patterns SD2.

Due to the directionality in the growth of the epitaxial layer EPL, the second source/drain pattern SD2 may be formed to fill the second recess RS2, but not the third recess RS3. Thus, a remaining space of the third recess RS3, which is not filled with the second source/drain pattern SD2, may be defined as the air gap AG. Since the inner spacer IP includes the inner insulating pattern ISP, which is formed of a low-k dielectric material, and the air gap AG, the inner spacer IP may be formed to have a dielectric constant close to that of the air.

The inner insulating pattern ISP and the air gap AG in the third recess RS3 may constitute the inner spacer IP. The sacrificial layer SAL may be spaced apart from the second source/drain pattern SD2 by the inner spacer IP.

Figure 20:
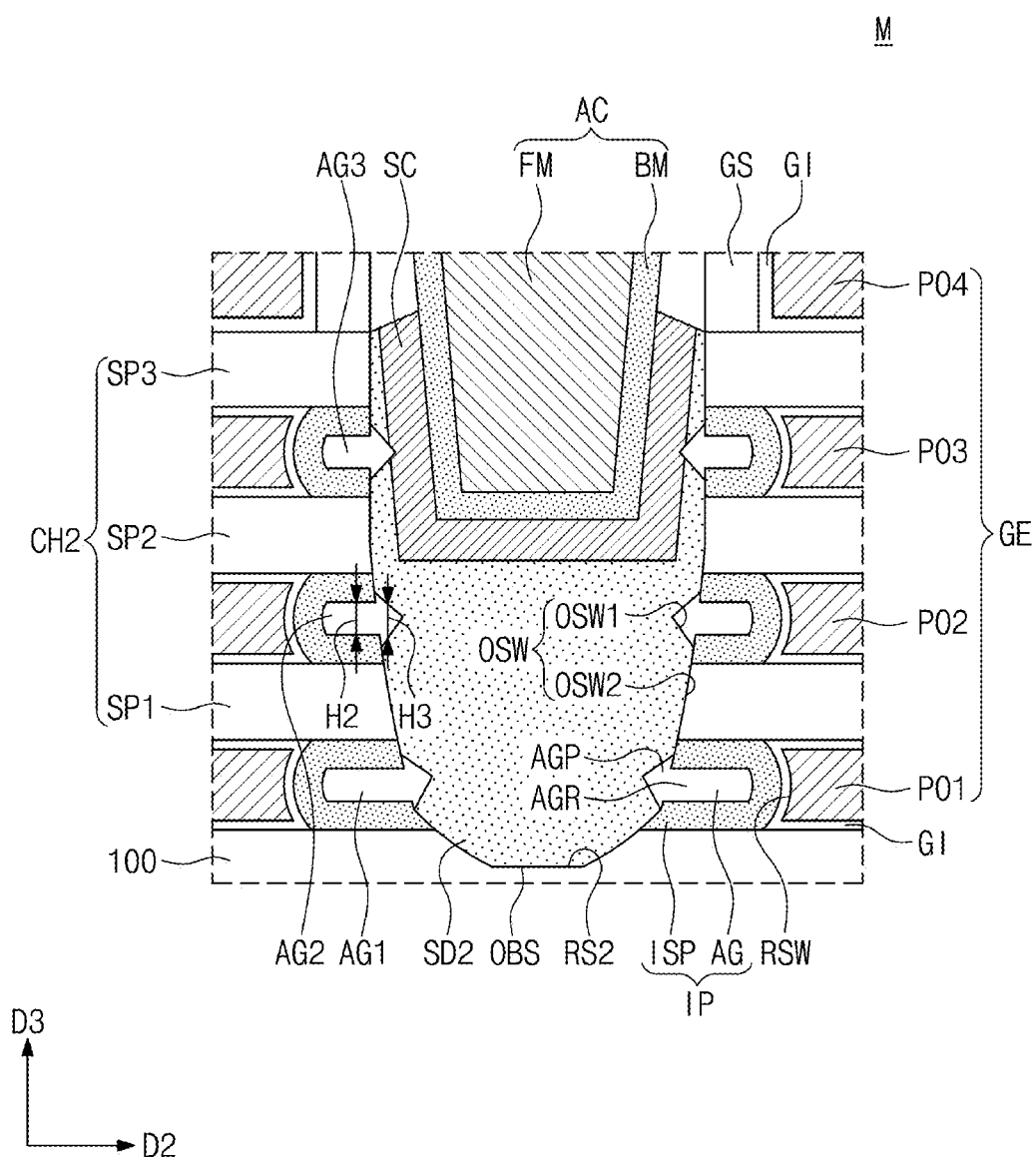
FIGS. 20 to 22 are enlarged sectional views, each of which is provided to described a semiconductor device according to example embodiments of the inventive concepts and to illustrate the portion M of FIG. 2B.
Figure 21:
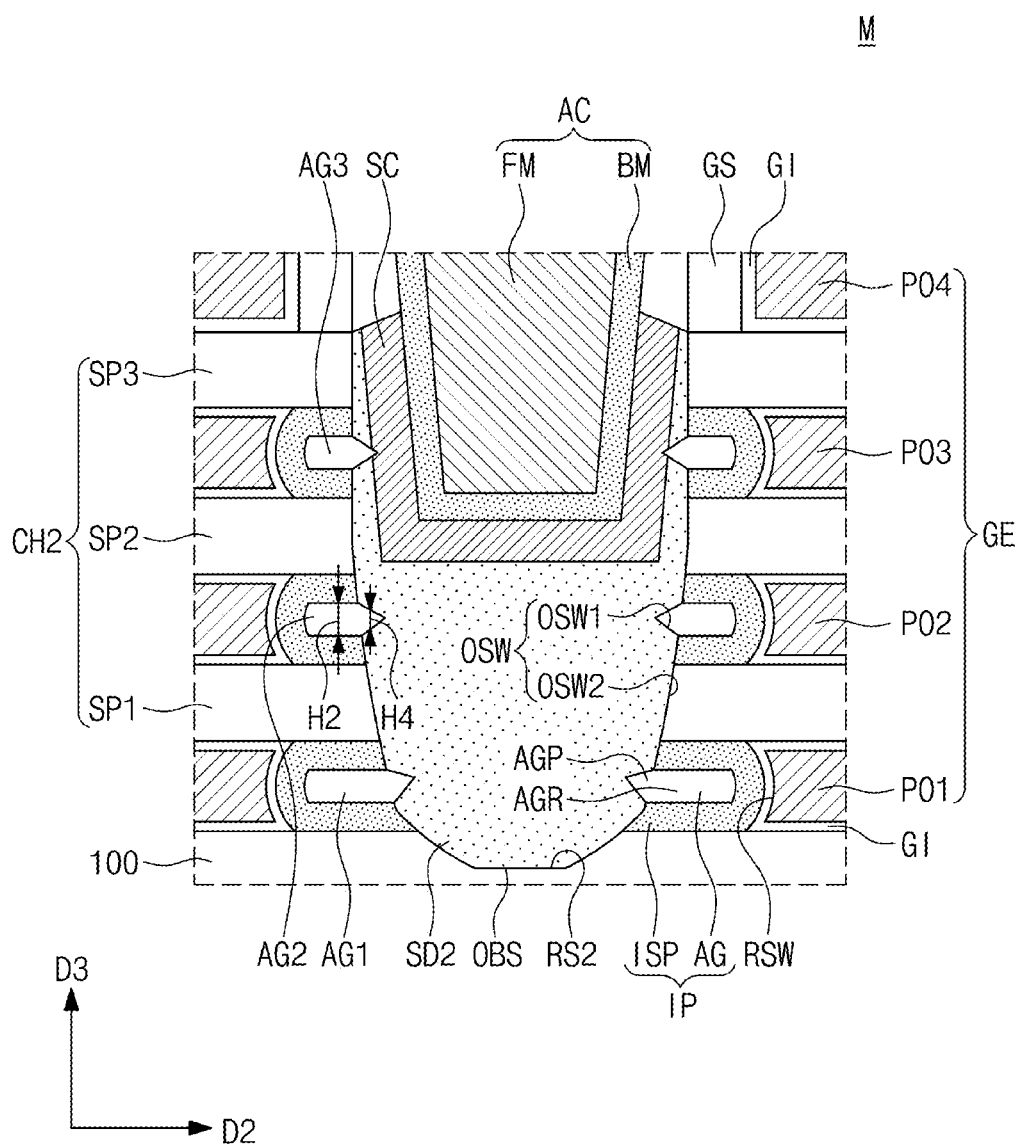
Figure 22:
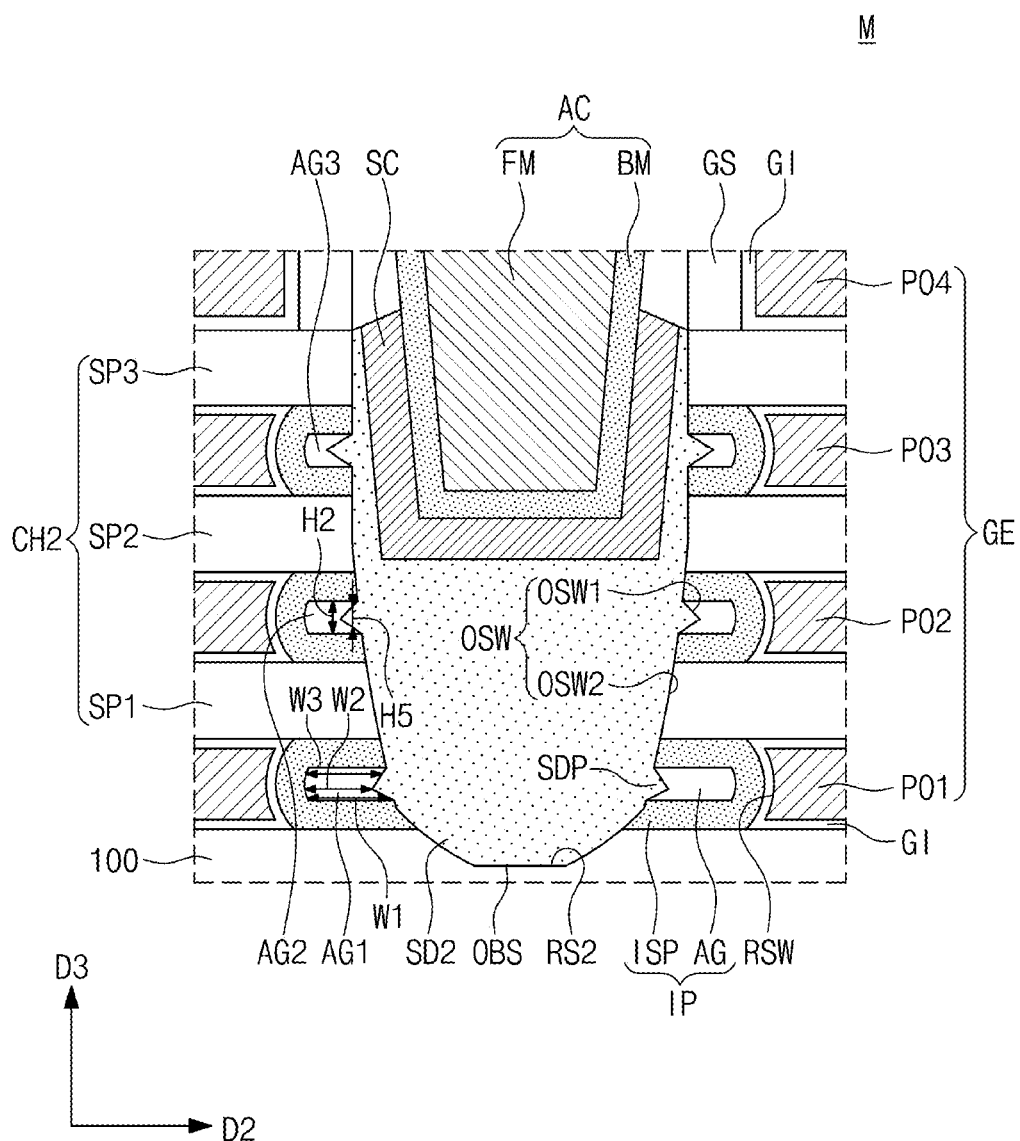

FIGS. 20 to 22 are enlarged sectional views, each of which is provided to described a semiconductor device according to example embodiments of the inventive concepts and to illustrate the portion M of FIG. 2B. In the following description, an element previously described with reference to FIGS. 1, 2A to 2D, and 3 may be identified by the same reference number without repeating an overlapping description thereof, for the sake of brevity.

Referring to FIG. 20, the air gap AG may include a gap region AGR and a protruding region AGP, which is extended from the gap region AGR toward the second source/drain pattern SD2. The gap region AGR may be enclosed by the inner insulating pattern ISP. The protruding region AGP may be enclosed by the second source/drain pattern SD2.

Specifically, a second air gap AG2 will be described exemplarily. The gap region AGR of the second air gap AG2 may have a second height H2 in the third direction D3. The protruding region AGP of the second air gap AG2 may have a third height H3 in the third direction D3. The third height H3 may be decreased with increasing distance from the gap region AGR. The largest value of the third height H3 may be larger than the second height H2. Accordingly, the second air gap AG2 may have an arrow shape. A first side surface OSW1 of the second source/drain pattern SD2 may have a concave profile, which corresponds to the protruding shape of the protruding region AGP.

Referring to FIG. 21, the air gap AG may include the gap region AGR and the protruding region AGP. Specifically, the second air gap AG2 will be described exemplarily. The gap region AGR of the second air gap AG2 may have a second height H2. The protruding region AGP of the second air gap AG2 may have a fourth height H4. The fourth height H4 may be decreased with increasing distance from the gap region AGR. However, unlike the structure of FIG. 20, the largest value of the fourth height H4 may be equal to or smaller than the second height H2. Accordingly, the second air gap AG2 may have a pentagonal shape.

Referring to FIG. 22, the second source/drain pattern SD2 may include a protruding pattern SDP extended into the air gap AG. The protruding pattern SDP may be extended into the air gap AG but may not fill the entire inner space of the air gap AG.

Specifically, the second air gap AG2 will be described exemplarily. The second air gap AG2 may have a second height H2. The protruding pattern SDP may have a fifth height H5 in the third direction D3. The fifth height H5 may be decreased with increasing distance from the second source/drain pattern SD2. The largest value of the fifth height H5 may be equal to or smaller than the second height H2. The second air gap AG2 may have a crown shape.

Unlike the structure of FIG. 3, a width of a first air gap AG1 may be decreased in the third direction D3 until it reaches its smallest value and then may be increased. Specifically, the second width W2 of the first air gap AG1 may be smaller than the first width W1. The second width W2 of the first air gap AG1 may be smaller than the third width W3.

The air gap AG according to example embodiments of the inventive concepts may have various shapes, as previously described with reference to FIGS. 3 and 20 to 22. The shape of the air gap AG may depend on a thickness of the inner insulating pattern ISP and a process condition of the SEG process previously described with reference to FIG. 18. Specifically, a growth direction of the epitaxial layer EPL of FIG. 18 may be changed depending on the process condition of the SEG process, and thus, the shape of the air gap AG may be variously changed.

Figure 23:
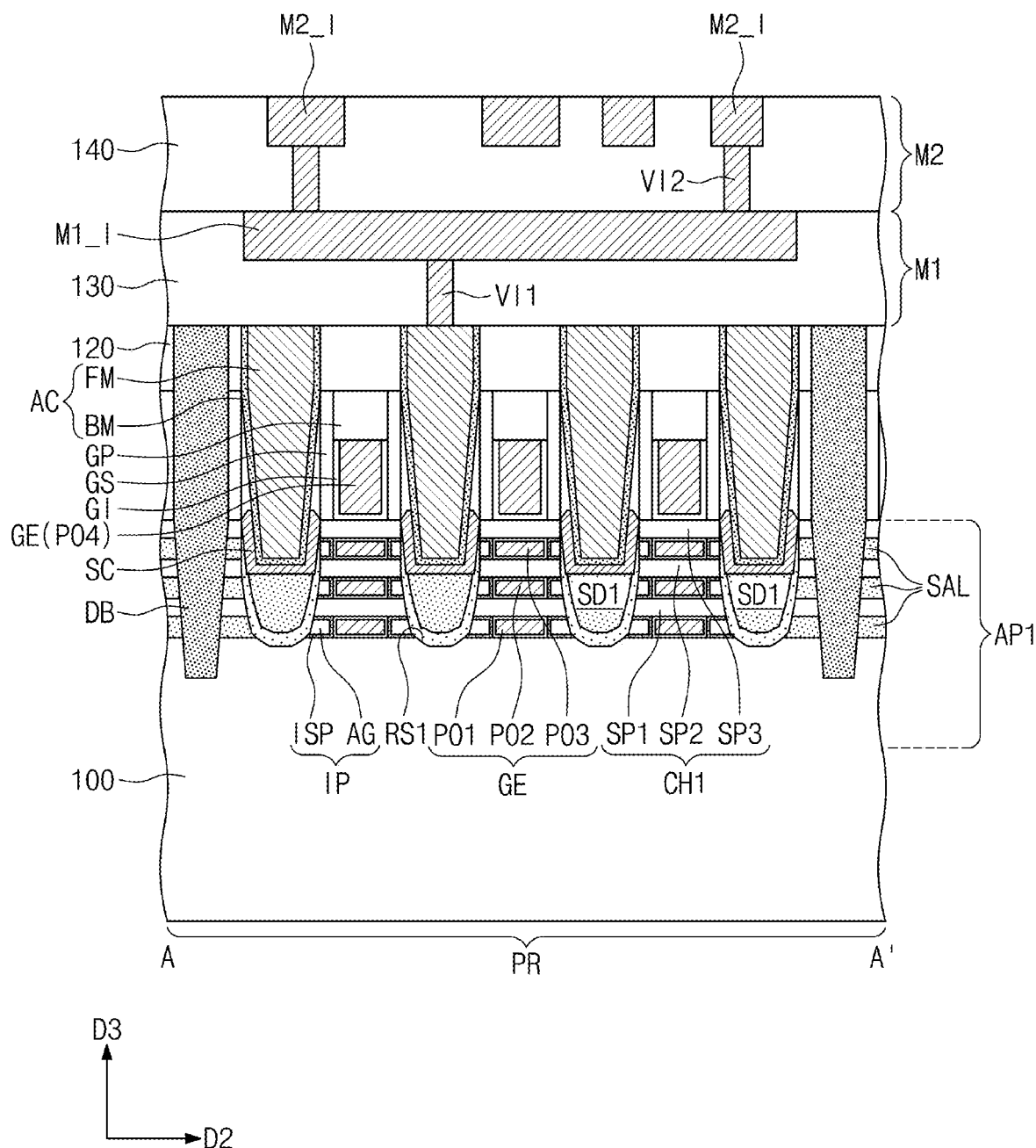
FIG. 23 is a sectional view, which is taken along the line A-A' of FIG. 1 to illustrate a semiconductor device according to example embodiments of the inventive concepts.

FIG. 23 is a sectional view, which is taken along the line A-A' of FIG. 1 to illustrate a semiconductor device according to example embodiments of the inventive concepts. In the following description, an element previously described with reference to FIGS. 1, 2A to 2D, and 3 may be identified by the same reference number without repeating an overlapping description thereof, for the sake of brevity.

Referring to FIG. 23, the inner spacers IP may also be provided on the PMOSFET region PR, like the NMOSFET region NR. In other words, the inner spacers IP may be respectively interposed between the first to third portions PO1, PO2, and PO3 of the gate electrode GE and the first source/drain pattern SD1. Each of the inner spacers IP on the PMOSFET region PR may include the inner insulating pattern ISP and the air gap AG, like that on the NMOSFET region NR.

The inner spacers IP on the PMOSFET region PR may reduce a parasitic capacitance between the gate electrode GE and the first source/drain pattern SD1. Thus, it may be possible to improve performance and electric characteristics of the semiconductor device in both of the NMOSFET and PMOSFET regions NR and PR.

In example embodiments where a SEG process is used to grown a SiGe layer, defects may be easily formed on the SiGe layer, which is formed on an insulating layer, such as a silicon nitride layer or a silicon oxide layer. Thus, if the inner spacer IP is composed of only the insulating layer, defects may be formed in the first source/drain pattern SD1, because the first source/drain pattern SD1 is formed by growing a SiGe layer using a SEG process. However, according to example embodiments of the inventive concepts, since the inner spacer IP is mainly composed of the air gap AG, it may be possible to reduce or prevent the defects from being formed during the growth process of the SiGe layer. Thus, according to example embodiments of the inventive concepts, it may be possible to reduce or prevent defects from being formed in the first source/drain pattern SD1 and thereby to reduce or prevent deterioration in performance of the semiconductor device.

According to example embodiments of the inventive concepts, a semiconductor device may include an inner spacer, which is provided between a gate electrode and a second source/drain pattern and has a very low dielectric constant. Thus, it may be possible to reduce a parasitic capacitance between the gate electrode and the second source/drain pattern and to improve performance and electric characteristics of the semiconductor device.

While example embodiments of the inventive concepts have been particularly shown and described, it will be understood by one of ordinary skill in the art that variations in form and detail may be made therein without departing from the spirit and scope of the attached claims.

What is claimed is:

1. A method of fabricating a semiconductor device, comprising:
   forming an active pattern on a substrate;
   forming a stacked structure on the active pattern, the stacked structure including sacrificial layers and active layers that are alternately stacked on the active pattern;
   forming a sacrificial pattern on the stacked structure;
   etching the stacked structure using the sacrificial pattern as an etch mask to form a recess in the stacked structure;
   etching the sacrificial layers exposed by the recess to form indented regions, respectively;
   forming an inner insulating layer in the indented regions, the inner insulating layer partially filling the indented regions;
   forming a protection layer on the inner insulating layer to fill the indented regions;
   removing portions of the inner insulating layer covering the active layers using the protection layer as an etch mask, the remaining inner insulating layer forming inner insulating patterns separated from each other;
   removing the protection layer; and
   forming a source/drain pattern in the recess, wherein air gaps are formed between the source/drain pattern and the inner insulating patterns as a result of the removing of the protection layer, the air gaps being formed in the indented regions, respectively, the air gaps including a first air gap, a second air gap and a third air gap, the second air gap being higher than the first air gap, the third air gap being higher than the second air gap, and a volume of the second air gap being larger than a volume of the third air gap.

2. The method of claim 1, further comprising replacing the sacrificial pattern and the sacrificial layers with a gate electrode,
wherein the gate electrode includes inner electrodes corresponding to the sacrificial layers, respectively.

3. The method of claim 1, wherein the inner insulating layer comprises silicon oxide or a material whose dielectric constant is lower than silicon oxide.

4. The method of claim 1, wherein a volume of the second air gap is larger than a volume of the third air gap.

5. The method of claim 1, wherein one of the air gaps includes a gap region and a protruding region, the protruding region extending toward the source/drain pattern, the protruding region having a first height in a direction perpendicular to a top surface of the substrate, the gap region having a second height in the direction perpendicular to the top surface of the substrate, and a largest value of the first height being larger than a largest value of the second height.

6. The method of claim 1, wherein the source/drain pattern includes a protruding pattern extending into one of the air gaps.

7. The method of claim 1, wherein a bottom surface of the source/drain pattern is in contact with the active pattern, and
wherein the source/drain pattern has a conductivity of an n-type.

8. The method of claim 1, wherein forming the source/drain pattern comprises forming an epitaxial layer on the active layers by performing a selective epitaxial growth process.

9. The method of claim 1, further comprising etching the protection layer by an isotropic etching process to expose the portions of the inner insulating layer.

10. A method of fabricating a semiconductor device, comprising:
forming an active pattern on a substrate;
forming a source/drain pattern on the active pattern;
forming a channel pattern connected to the source/drain pattern, the channel pattern comprising semiconductor patterns that are stacked and spaced apart from each other;
forming a gate electrode on the channel pattern, the gate electrode comprising inner electrodes including a first inner electrode between the active pattern and a lowermost one of the semiconductor patterns and second inner electrodes between the semiconductor patterns, respectively; and
forming inner spacers between the inner electrodes and the source/drain pattern,
wherein the forming of the inner spacers includes
forming indented regions in a recess where the source/drain pattern is formed,
forming an inner insulating layer in the indented regions,
forming a protection layer on the inner insulating layer to fill the indented regions, and
forming air gaps by removing the protection layer, the air gaps being formed in the indented regions, respectively, the air gaps including a first air gap, a second air gap and a third air gap, the second air gap being higher than the first air gap, the third air gap being higher than the second air gap, and a volume of the second air gap being larger than a volume of the third air gap.

11. The method of claim 10, wherein the inner insulating layer comprises silicon oxide or a material whose dielectric constant is lower than silicon oxide.

12. The method of claim 10, wherein the forming of the inner spacers further comprises:
etching the protection layer by an isotropic etching process to expose a portion of the inner insulating layer; and
removing the portion of the inner insulating layer using the protection layer as an etch mask.

13. The method of claim 10, wherein one of the air gaps includes a gap region and a protruding region, the protruding region extending toward the source/drain pattern, the protruding region having a first height in a direction perpendicular to a top surface of the substrate, the gap region having a second height in the direction perpendicular to the top surface of the substrate, and a largest value of the first height being larger than a largest value of the second height.

14. The method of claim 10, wherein the source/drain pattern includes a protruding pattern extending into one of the air gaps.

15. A method of fabricating a semiconductor device, comprising:
forming a first active pattern and a second active pattern on PMOSFET and NMOSFET regions of a substrate, respectively;
forming a first source/drain pattern and a second source/drain pattern on the first active pattern and the second active pattern, respectively;
forming a first channel pattern and a second channel pattern, connected to the first source/drain pattern and the second source/drain pattern, respectively, and each of which includes a first semiconductor pattern, a second semiconductor pattern, and a third semiconductor pattern sequentially stacked to be spaced apart from each other;
forming a first gate electrode and a second gate electrode on the first and second channel patterns, respectively, each of the first and second gate electrodes comprising a first inner electrode between the substrate and the first semiconductor pattern, a second inner electrode between the first semiconductor pattern and the second semiconductor pattern, a third inner electrode between the second semiconductor pattern and the third semiconductor pattern, and an outer electrode on the third semiconductor pattern;
forming inner spacers, between the first to third inner electrodes and the second source/drain pattern;
forming a first gate insulating layer and a second gate insulating layer, between the first channel pattern and the first gate electrode and between the second channel pattern and the second gate electrode, respectively;
forming a first gate spacer and a second gate spacer on side surfaces of the first and second gate electrodes, respectively;
forming a first gate capping pattern and a second gate capping pattern on top surfaces of the first and second gate electrodes, respectively;
forming active contacts coupled to the first and second source/drain patterns, respectively;
forming gate contacts coupled to the first and second gate electrodes, respectively; and forming a metal layer comprising first interconnection lines that are electrically connected to the active contacts and the gate contacts, wherein the forming of the inner spacers includes
forming indented regions in a recess where the second source/drain pattern is formed,
forming an inner insulating layer in the indented regions,
forming a protection layer on the inner insulating layer to fill the indented regions, and
forming air gaps in the indented regions by removing the protection layer, the air gaps being formed in the indented regions, respectively, the air gaps including a first air gap, a second air gap and a third air gap, the second air gap being higher than the first air gap, the third air gap being higher than the second air gap, and a volume of the second air gap being larger than a volume of the third air gap.

16. The method of claim 15, wherein the inner insulating layer comprises silicon oxide or a material whose dielectric constant is lower than silicon oxide.

17. The method of claim 15, wherein the forming of the inner spacers further comprises:
etching the protection layer by an isotropic etching process to expose a portion of the inner insulating layer; and
removing the portion of the inner insulating layer using the protection layer as an etch mask.

18. The method of claim 15, wherein one of the air gaps includes a gap region and a protruding region, the protruding region extending toward the source/drain pattern, the protruding region having a first height in a direction perpendicular to a top surface of the substrate, the gap region having a second height in the direction perpendicular to the top surface of the substrate, and a largest value of the first height being larger than a largest value of the second height.

19. The method of claim 15, wherein the second source/drain pattern includes a protruding pattern extending into one of the air gaps.

20. The method of claim 1, wherein a largest width of the second air gap is larger than a largest width of the third air gap.

* * * * *